(12) United States Patent
Chou et al.

(10) Patent No.: US 10,991,629 B2
(45) Date of Patent: *Apr. 27, 2021

(54) METHOD OF FORMING PROTECTION LAYER IN FINFET DEVICE

(71) Applicant: Taiwan Semiconductor Manufacturing Co., Ltd., Hsin-Chu (TW)

(72) Inventors: Jen-Chun Chou, Hsin-Chu (TW); Ren-Yu Chang, Hsin-Chu (TW); Yu-Chiang Chou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/583,052

(22) Filed: Sep. 25, 2019

(65) Prior Publication Data

US 2020/0020596 A1    Jan. 16, 2020

Related U.S. Application Data

(63) Continuation of application No. 15/724,800, filed on Oct. 4, 2017, now Pat. No. 10,468,309.

(60) Provisional application No. 62/526,628, filed on Jun. 29, 2017.

(51) Int. Cl.
| | | |
|---|---|---|
| *H01L 21/00* | (2006.01) |
| *H01L 21/8238* | (2006.01) |
| *H01L 21/265* | (2006.01) |
| *H01L 29/36* | (2006.01) |
| *H01L 29/66* | (2006.01) |
| *H01L 29/51* | (2006.01) |
| *H01L 29/08* | (2006.01) |

(52) U.S. Cl.
CPC .. *H01L 21/823807* (2013.01); *H01L 21/2652* (2013.01); *H01L 21/823814* (2013.01); *H01L 21/823821* (2013.01); *H01L 29/36* (2013.01); *H01L 29/66545* (2013.01); *H01L 29/0847* (2013.01); *H01L 29/513* (2013.01); *H01L 29/518* (2013.01)

(58) Field of Classification Search
None
See application file for complete search history.

(56) References Cited

U.S. PATENT DOCUMENTS

| | | | |
|---|---|---|---|
| 9,859,164 B1 | 1/2018 | Hsieh | |
| 10,468,309 B2 * | 11/2019 | Chou | ............... H01L 21/2652 |
| 2012/0080757 A1 | 4/2012 | Kato | |

* cited by examiner

*Primary Examiner* — Reema Patel
(74) *Attorney, Agent, or Firm* — Duane Morris LLP

(57) ABSTRACT

A fin-based transistor and method for making same. In some embodiments, the transistor includes a first fin and a second fin formed on a substrate, the first and second fins being laterally spaced from each other, wherein an upper portion of the first fin is doped with a first type of dopant and an upper portion of the second fin is doped with a second type of dopant different from the first type of dopant; a protection layer formed over the first and second fins, wherein the protection layer comprises a dielectric material selected from a group comprising: silicon nitride, silicon oxynitride, and a combination thereof; and source and drain features formed in respective side portions of the first and second fins.

20 Claims, 26 Drawing Sheets

METHOD OF FORMING PROTECTION LAYER IN FINFET DEVICE

CROSS-REFERENCE TO RELATED APPLICATION

This application is a continuation application of U.S. patent application Ser. No. 15/724,800, filed Oct. 4, 2017, which claims priority to U.S. Provisional Patent Application No. 62/526,628, filed on Jun. 29, 2017, both of which are incorporated by reference herein in their entireties.

BACKGROUND

Integrated circuits (IC's) typically include a large number of components, particularly transistors. One type of transistor is a metal-oxide-semiconductor field-effect-transistor (MOSFET). MOSFET devices typically include a gate structure on top of a semiconductor substrate. Both sides of the gate structure are doped to form source and drain regions. A channel is formed between the source and drain regions beneath the gate. Based on a voltage bias applied to the gate, electric current may either be allowed to flow through the channel or be inhibited from doing so.

In some cases, the channel may be formed as a fin-like structure (herein "fin"). Such a fin protrudes beyond a top surface of the substrate and runs perpendicular to the gate structure formed on the substrate and the fin. In general, a field-effect-transistor using such a fin as a channel is referred to as a fin field-effect-transistor ("FinFET"). As mentioned above, an IC typically includes plural transistors, e.g., FinFET's. The plural FinFET's of the IC may each have a respective threshold voltage ($V_{th}$) so as to allow the IC to be used in various applications. For example, some of the plural FinFET's may have a relatively higher $V_{th}$, and some of the FinFET's may have a relatively lower $V_{th}$. A FinFET's $V_{th}$ may be defined by various factors, one of which is a doping concentration of the FinFET's respective fin channel. The doping concentration of the fin channel is typically determined based on an energy level (generally in the unit of keV) used by an ion implantation process to dope the fin channel. More specifically, the ion implantation process includes bombarding plural dopants that are energized at that particular energy level on the fin channel so as to implant the dopants into the fin channel. As such, the fin channel may be doped with a corresponding doping concentration. However, when the energized dopants bombard the fin channel, the fin channel and a respective gate dielectric layer (generally formed over the fin channel) may be damaged. For example, various defects may be formed on the fin channel and/or the gate dielectric layer, which disadvantageously impacts overall performance and reliability (e.g., mobility, on/off ratio, etc.) of the FinFET. Thus, conventional techniques to dope a fin channel of a FinFET are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
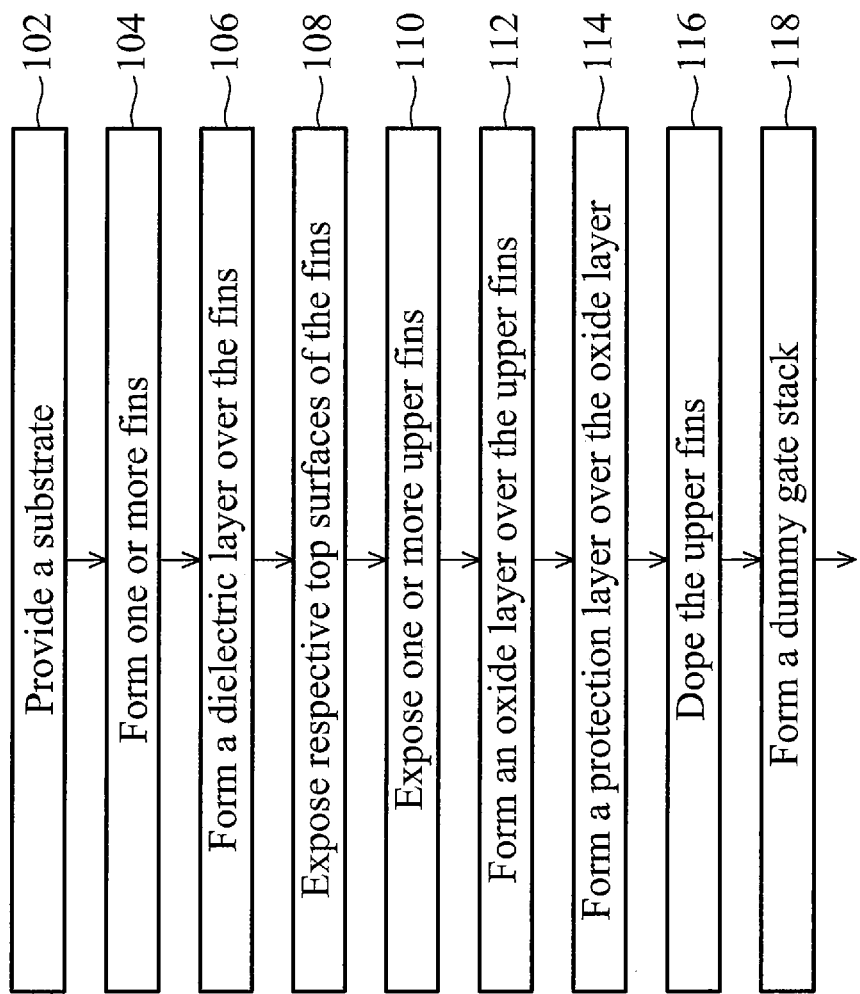
FIGS. 1A and 1B illustrate a flow chart of an embodiment of a method to form a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device that includes a protection layer and method of forming the same. More particularly, the present disclosure provides a method to form a protection layer over a fin-like channel of a fin field-effect-transistor (FinFET) before doping the fin-like channel. In some embodiments, the protection layer may extend along sidewalls and overlays a top surface of the fin-like channel. As such, the semiconductor device formed by the method, in accordance with the present disclosure, may be immune from the above-mentioned damage that typically occurs during a channel doping process. Moreover, in some embodiments, such a protection layer may further provide another layer of protection on the fin-like channel during a later dummy gate removal process that is used to form a conductive gate feature (e.g., a metal gate electrode) of the FinFET, which will be discussed in further detail below.

FIG. 1 illustrates a flowchart of a method 100 to form a semiconductor device according to one or more embodiments of the present disclosure. It is noted that the method 100 is merely an example, and is not intended to limit the present disclosure. In some embodiments, the semiconductor device is, at least part of, a FinFET. As employed in the present disclosure, the FinFET refers to any fin-based, multi-gate transistor. It is noted that the method of FIG. 1 does not produce a completed FinFET. A completed FinFET may be fabricated using complementary metal-oxide-semiconductor (CMOS) technology processing. Accordingly, it is understood that additional operations may be provided before, during, and after the method 100 of FIG. 1, and that some other operations may only be briefly described herein.

In some embodiments, the method 100 starts with operation 102 in which a semiconductor substrate is provided. The method 100 continues to operation 104 in which one or more fins are formed extending beyond a major surface of the semiconductor substrate. The method 100 continues to operation 106 in which a dielectric material is deposited over the semiconductor substrate. The method 100 continues to operation 108 in which respective top surfaces of the one or more fins are exposed. The method 100 continues to operation 110 in which an upper fin of each fin is exposed. The method 100 continues to operation 112 in which an oxide layer is formed over each exposed upper fin. The method 100 continues to operation 114 in which a protection layer is formed over each oxide layer overlaying the respective upper fin. The method 100 continues to operation 116 in which the one or more upper fins are respectively doped by performing one or more ion implantation processes. The method 100 continues to operation 118 in which a dummy gate stack is formed over respective central portions of the protection layers, the oxide layers, and the upper fins. The method 100 continues to operation 120 in which source/drain features are respectively formed at sides of the dummy gate stack. The method 100 continues to operation 122 in which at least part of the dummy gate stack is removed to expose the respective central portions of the protection layers. The method 100 continues to operation 124 in which a conducive gate feature is formed over the central portion of each upper fin.

In some embodiments, operations of the method 100 may be associated with perspective views of a semiconductor device 200 at various fabrication stages as shown in FIGS. 2A, 3A, 4A, 5A, 6A, 7A, 8A, 9A, 10A, 11A, 12A, and 13A, respectively, and corresponding cross-sectional views as shown in FIGS. 2B, 3B, 4B, 5B, 6B, 7B, 8B, 9B, 10B, 11B, 12B, and 13B. In some embodiments, the semiconductor device 200 may be a FinFET. The FinFET 200 may be included in a microprocessor, memory cell, and/or other integrated circuit (IC). Also, FIGS. 2A through 13B are simplified for a better understanding of the concepts of the present disclosure. For example, although the figures illustrate the FinFET 200, it is understood the IC may comprise a number of other devices comprising resistors, capacitors, inductors, fuses, etc., which are not shown in FIGS. 2A through 13B, for purposes of clarity of illustration.

Figure 2A:
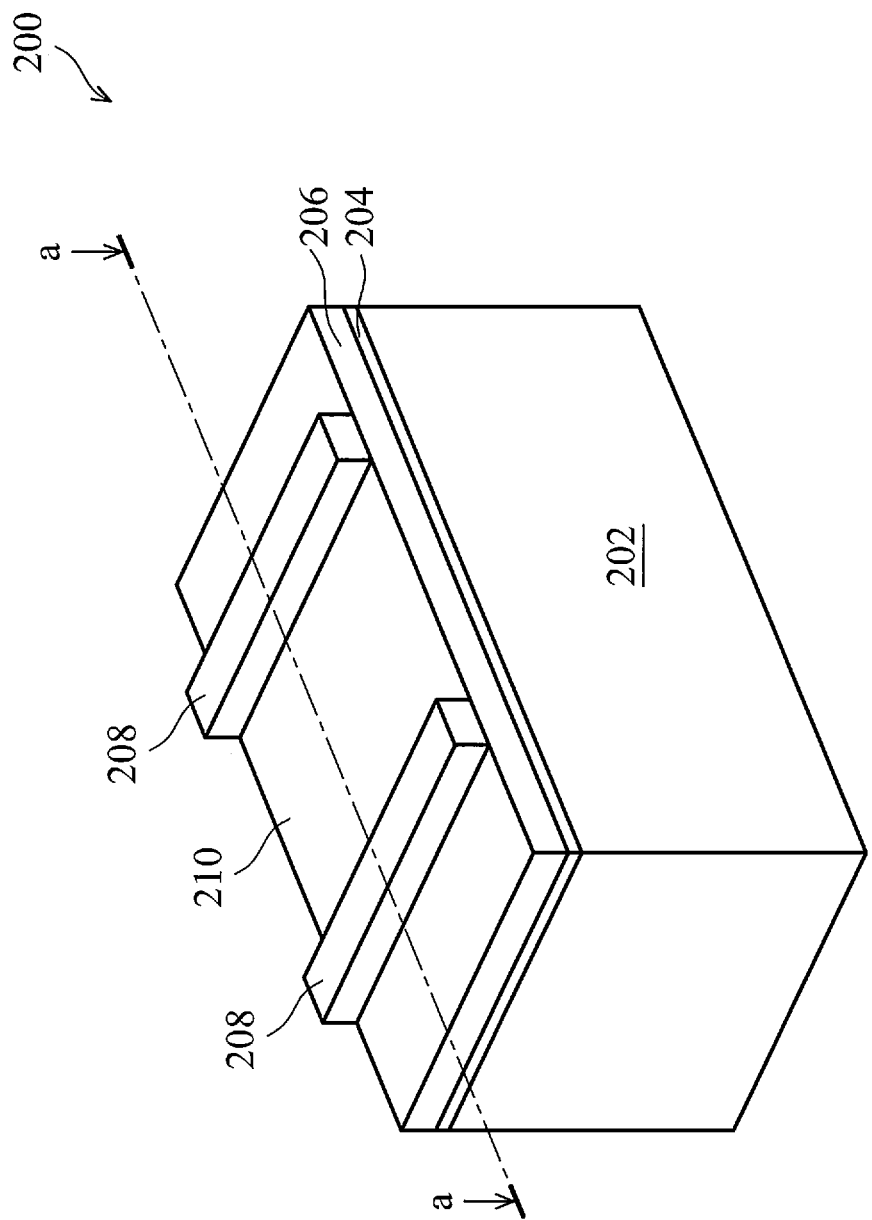
FIGS. 2A, 3A, 4A, 5A, 6A, 7A, 8A, 9A, 10A, 11A, 12A, and 13A illustrate perspective views of an exemplary semiconductor device, made by the method of FIGS. 1A-1B, during various fabrication stages, in accordance with some embodiments.
Figure 2B:
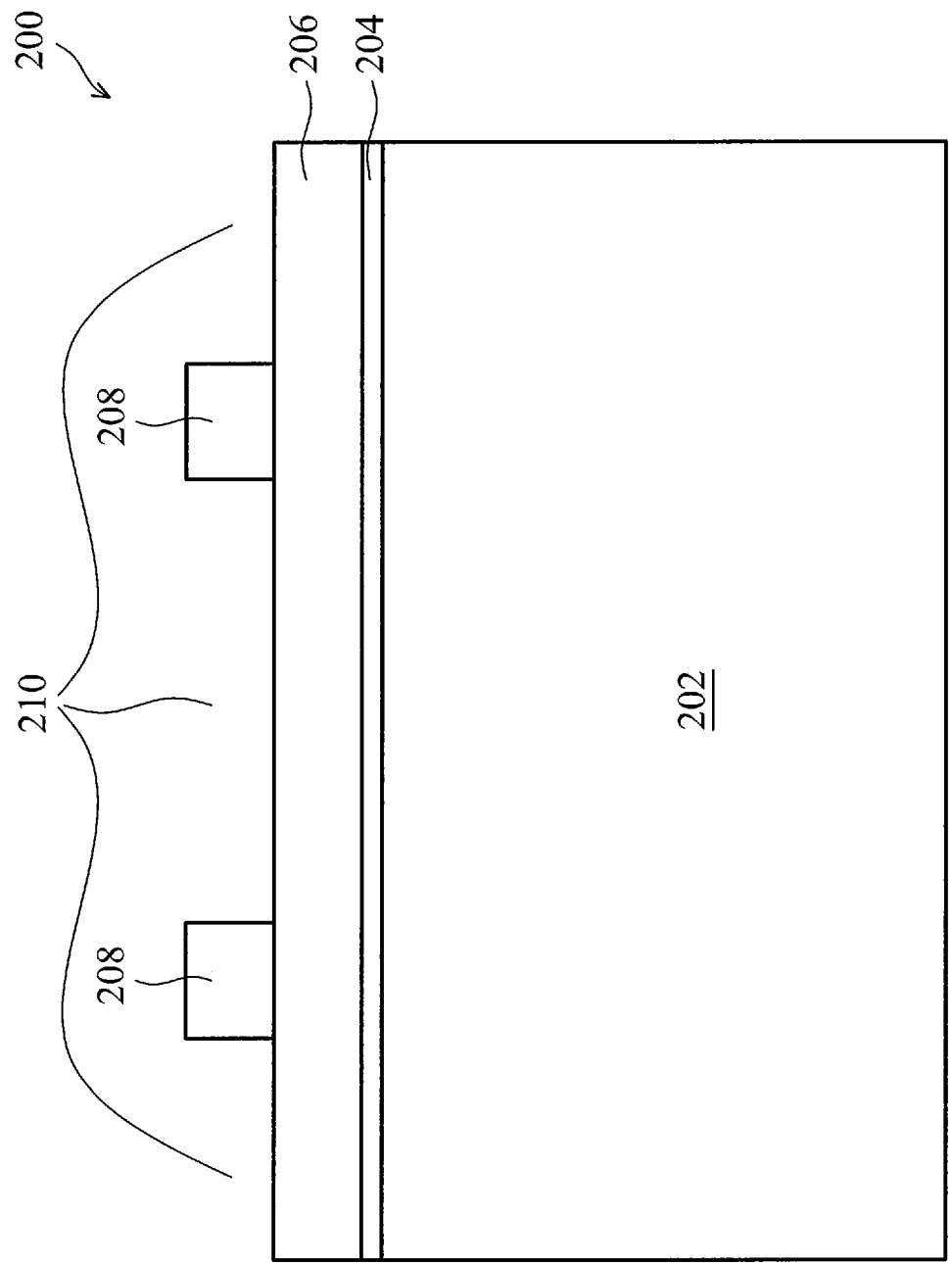
FIGS. 2B, 3B, 4B, 5B, 6B, 7B, 8B, 9B, 10B, 11B, 12B, and 13B illustrate corresponding cross-sectional views of FIGS. 2A, 3A, 4A, 5A, 6A, 7A, 8A, 9A, 10A, 11A, 12A, and 13A, in accordance with some embodiments.

FIG. 2A is a perspective view of the FinFET 200 including a substrate 202 at one of the various stages of fabrication corresponding to operation 102 of FIG. 1A, according to some embodiments, and FIG. 2B is a cross-sectional view of the FinFET 200 taken along line a-a of FIG. 2A. As shown, the substrate 202 is covered by a pad layer 204, a mask layer 206, and a photo-sensitive layer 208 that is patterned with one or more openings 210. The photo-sensitive layer 208 is patterned to form fin(s) of the FinFET 200, which will be discussed in the following operations.

In some embodiments, the substrate 202 comprises a crystalline silicon substrate (e.g., wafer). In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In some embodiments, the pad layer 204 may be a thin film comprising silicon oxide formed, for example, using a thermal oxidation process. The pad layer 204 may act as an adhesion layer between the semiconductor substrate 202 and the mask layer 206. The pad layer 204 may also act as an etch stop layer while etching the mask layer 206. In some embodiments, the mask layer 206 is formed of silicon nitride, for example, using low-pressure chemical vapor deposition (LPCVD) or plasma enhanced chemical vapor deposition (PECVD). The mask layer 206 is used as a hard mask during subsequent photolithography processes. The photo-sensitive layer 208 is formed on the mask layer 206, and then patterned thereby forming the openings 210 in the photo-sensitive layer 208.

Figure 3A:
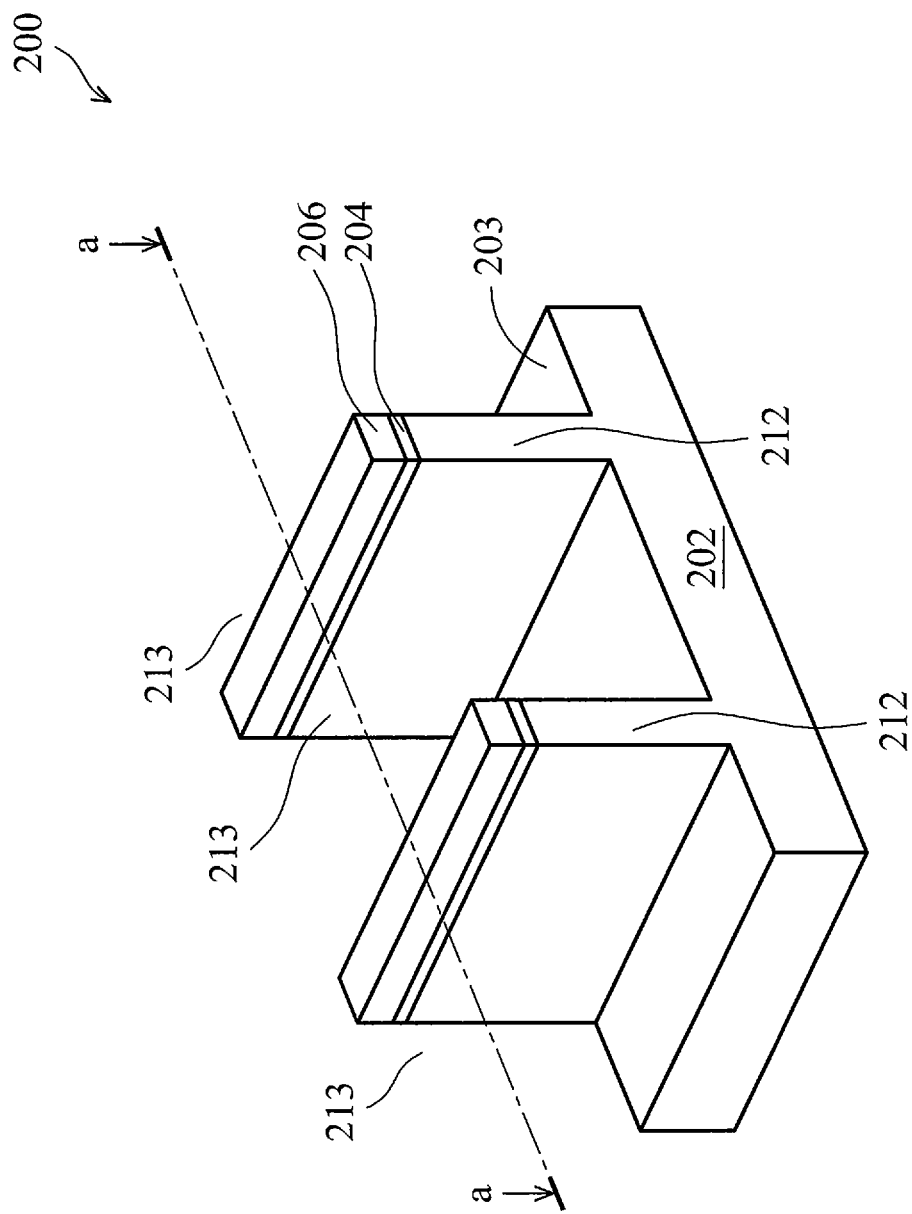
Figure 3B:
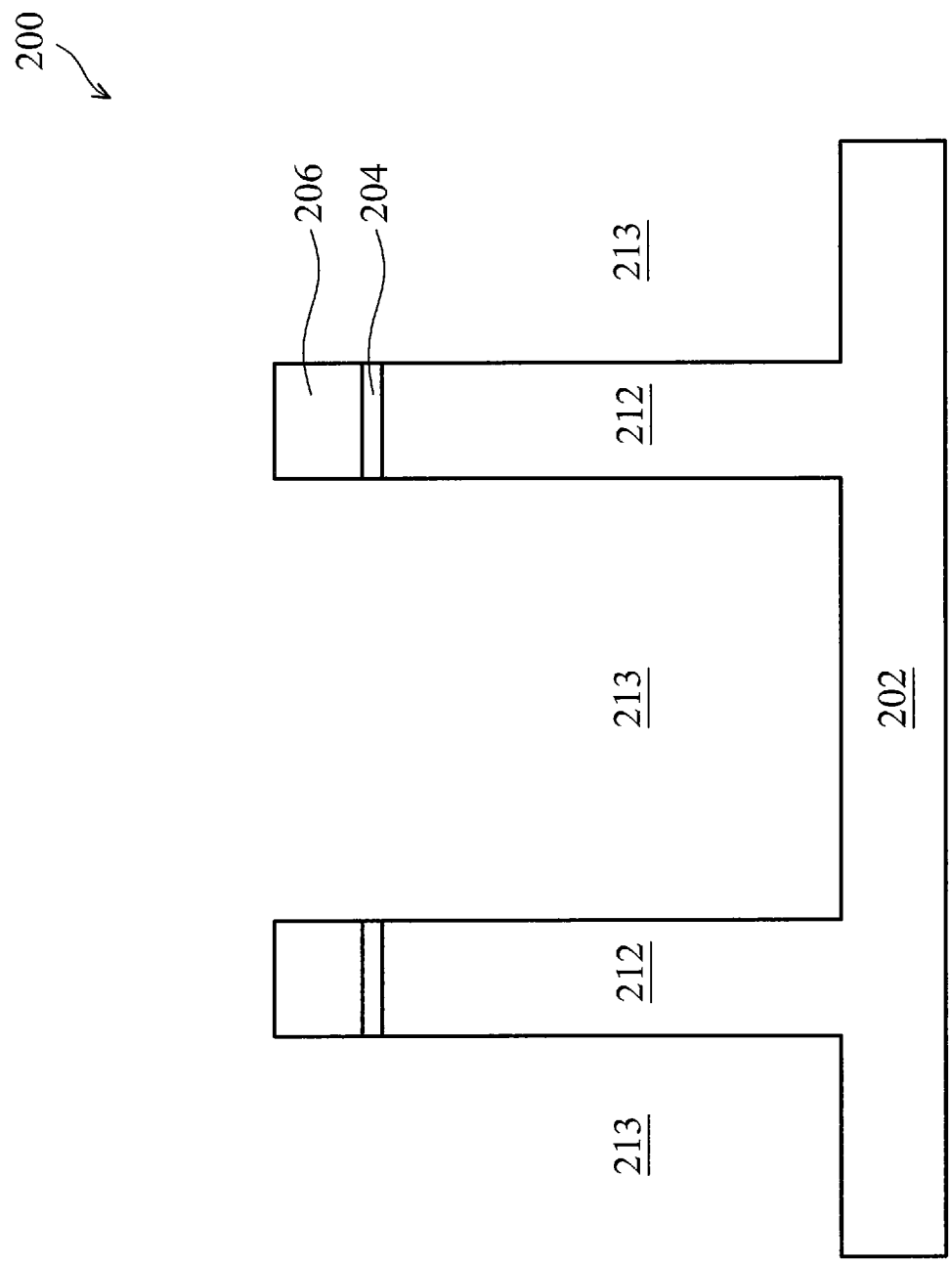

FIG. 3A is a perspective view of the FinFET 200 including one or more fins 212 at one of the various stages of fabrication corresponding to operation 104 of FIG. 1A, according to some embodiments, and FIG. 3B is a cross-sectional view of the FinFET 200 taken along line a-a of FIG. 3A. As shown, the neighboring fins 212 are spaced by a central trench 213. It is noted that although only two fins 212 are shown in the illustrated embodiments of FIGS. 3A and 3B (and the following figures), any desired number of fins may be formed on the semiconductor substrate 202 using the photo-sensitive layer 208 (FIGS. 2A and 2B) with an according pattern. Thus, the left and right trenches 213 in FIGS. 3A and 3B may be respectively coupled between one of the shown fins 212, and another non-shown fin.

In some embodiments, the fins 212 are formed by at least some of the following processes. The mask layer 206 and pad layer 204 are etched through openings 210 (FIGS. 2A and 2B) to expose underlying semiconductor substrate 202. By using remaining pad layer 204 and the mask layer 206, as shown in FIGS. 3A and 3B, the exposed semiconductor substrate 202 is then etched to form the trenches 213 so as to cause a major surface 203 of the semiconductor substrate 202 to be exposed. Portions of the semiconductor substrate 202 sandwiched between the trenches 213 are thus formed as the fins 212. The fins 212 each extends upward from the major surface 203. The trenches 213 may be strips (viewed from the top of the FinFET 200) parallel to each other, and closely spaced with respect to each other. After the fins 212 are formed, the photo-sensitive layer 208 (not shown in FIGS. 3A and 3B for purposes of clarity) is removed. Subsequently, a cleaning process may be performed to remove a native oxide of the semiconductor substrate 202. The cleaning may be performed using diluted hydrofluoric (DHF) acid, or the like.

Figure 4A:
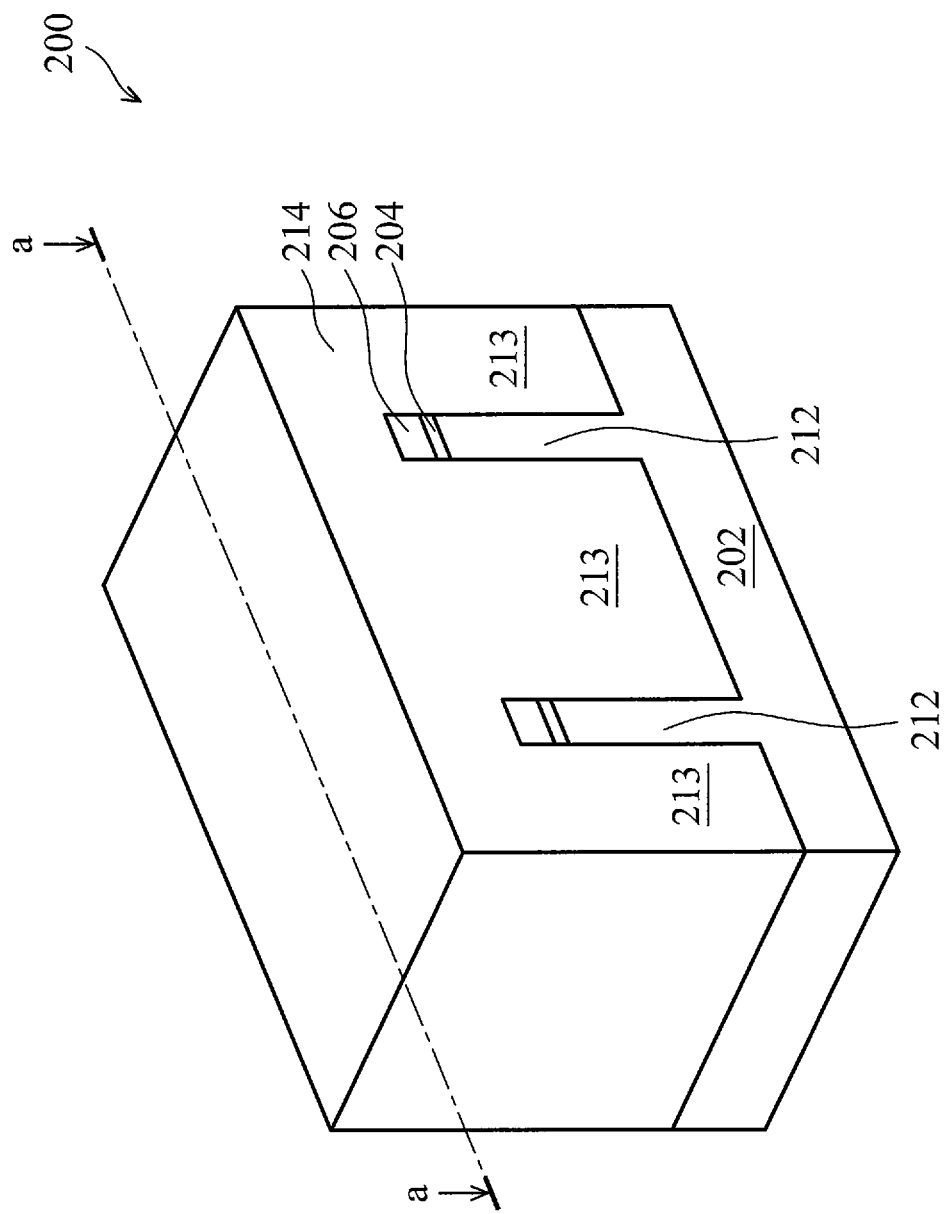
Figure 4B:
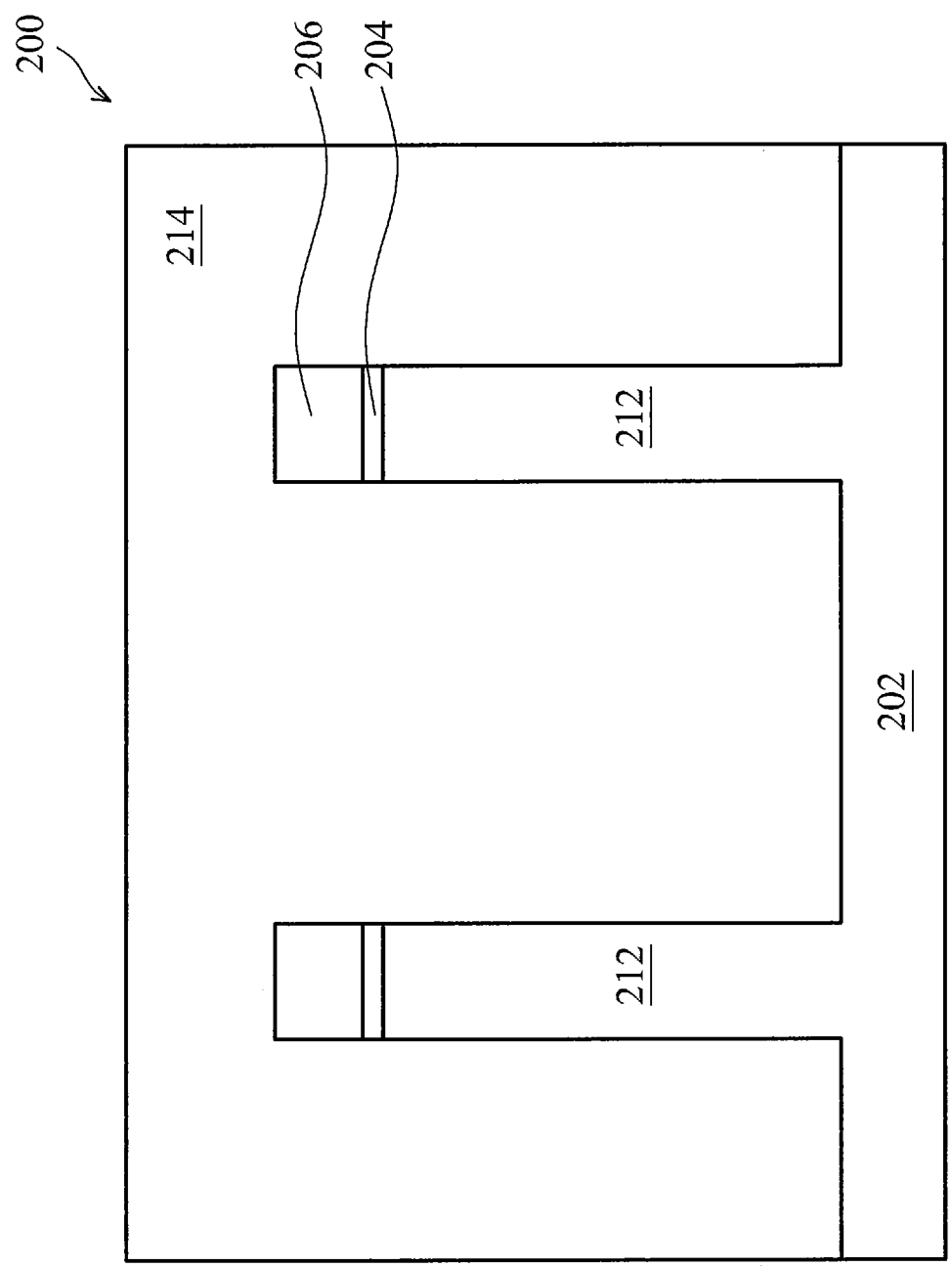

FIG. 4A is a perspective view of the FinFET 200 including a dielectric material 214 formed over the substrate 202, the fins 212, the pad layer 204, and the mask layer 206 at one of the various stages of fabrication corresponding to operation 106 of FIG. 1A, according to some embodiments, and FIG. 4B is a cross-sectional view of the FinFET 200 taken along line a-a of FIG. 4A. As shown, the dielectric material 214 is formed over the whole FinFET 200 such that the entire trenches 213 are filled by the dielectric material 214.

In an embodiment, the dielectric material 214 may be deposited over the substrate 202 using a high-density-plasma (HDP) CVD process with reacting precursors, e.g., silane ($SiH_4$) and oxygen ($O_2$). In another embodiment, the dielectric material 214 may be deposited over the substrate 202 using a sub-atmospheric CVD (SACVD) process or a high aspect-ratio process (HARP), wherein process gases used in such processes may comprise tetraethylorthosilicate (TEOS) and ozone ($O_3$). In yet another embodiment, the dielectric material 214 may be deposited over the substrate 202 using a spin-on-dielectric (SOD) process such as, for example, hydrogen silsesquioxane (HSQ), methyl silsesquioxane (MSQ), or the like.

Figure 5A:
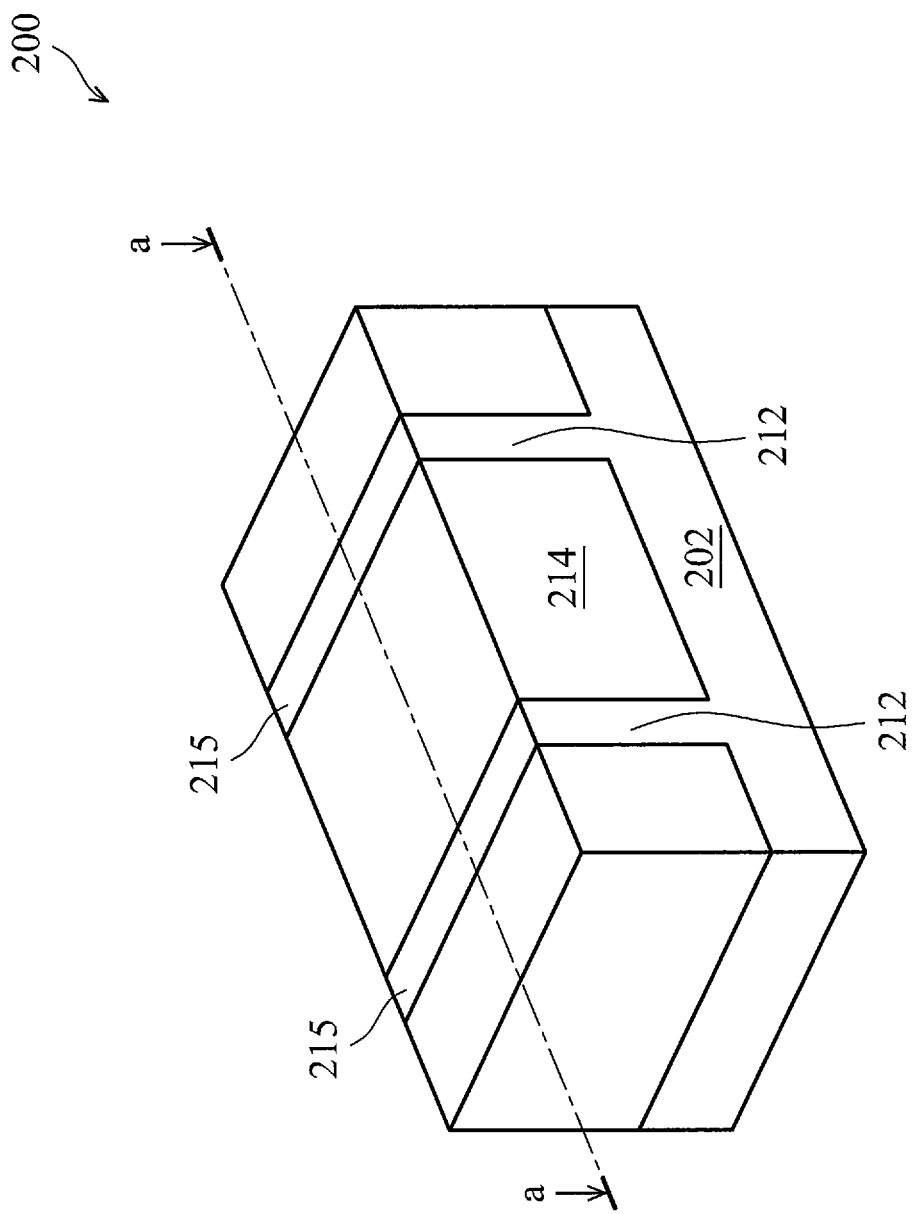
Figure 5B:
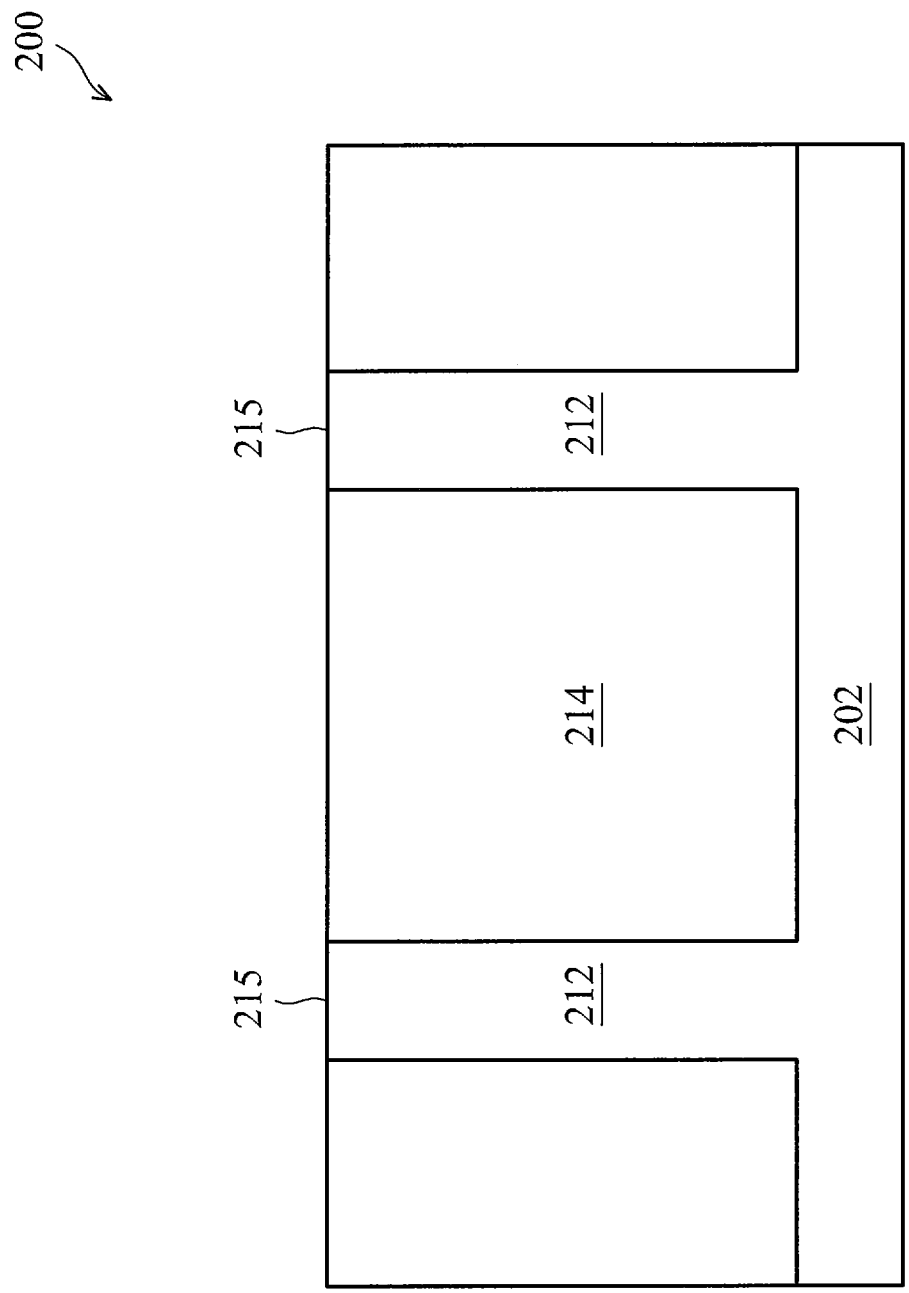

FIG. 5A is a perspective view of the FinFET 200 including top surfaces 215 of the fins 212 being exposed at one of the various stages of fabrication corresponding to operation 108 of FIG. 1A, according to some embodiments, and FIG. 5B is a cross-sectional view of the FinFET 200 taken along line a-a of FIG. 5A. In some embodiments, the top surface 215 is exposed by performing a polishing process (e.g., a chemical-mechanical polishing process) on the dielectric material 214 (FIGS. 4A and 4B) until the mask layer 206 is again exposed. The mask layer 206 and the pad layer 204 are then removed to expose the top surface 215. In some embodiments, when the mask layer 206 is formed of silicon nitride, the mask layer 206 may be removed using a wet process using hot phosphoric acid ($H_3PO_4$), and when the pad layer 204 is formed of silicon oxide, the pad layer 204 may be removed using diluted hydrofluoric acid (HF). In some alternative embodiments, the removal of the mask layer 206 and the pad layer 204 may be performed after a recession process performed on the dielectric material 214, which will be discussed in FIGS. 6A and 6B as follows.

Figure 6A:
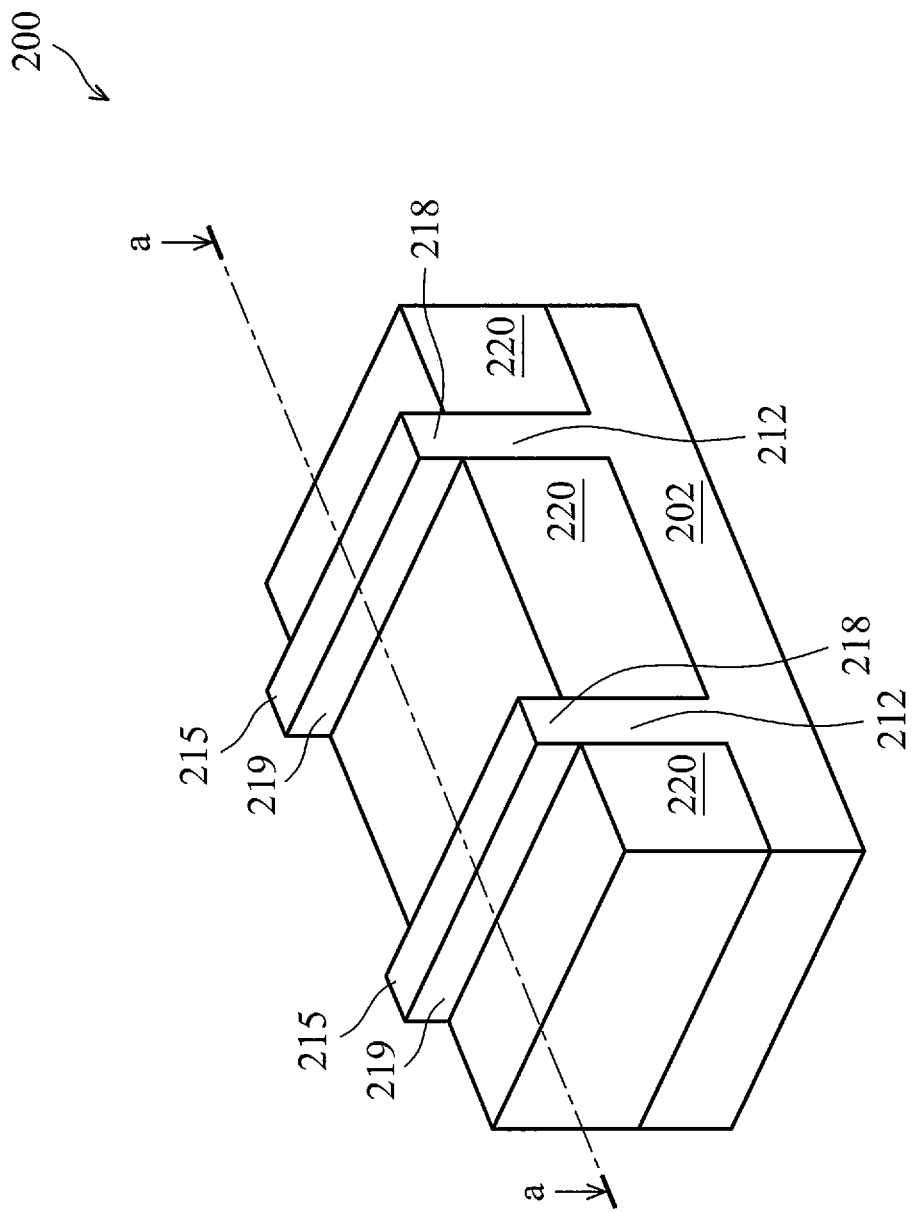
Figure 6B:
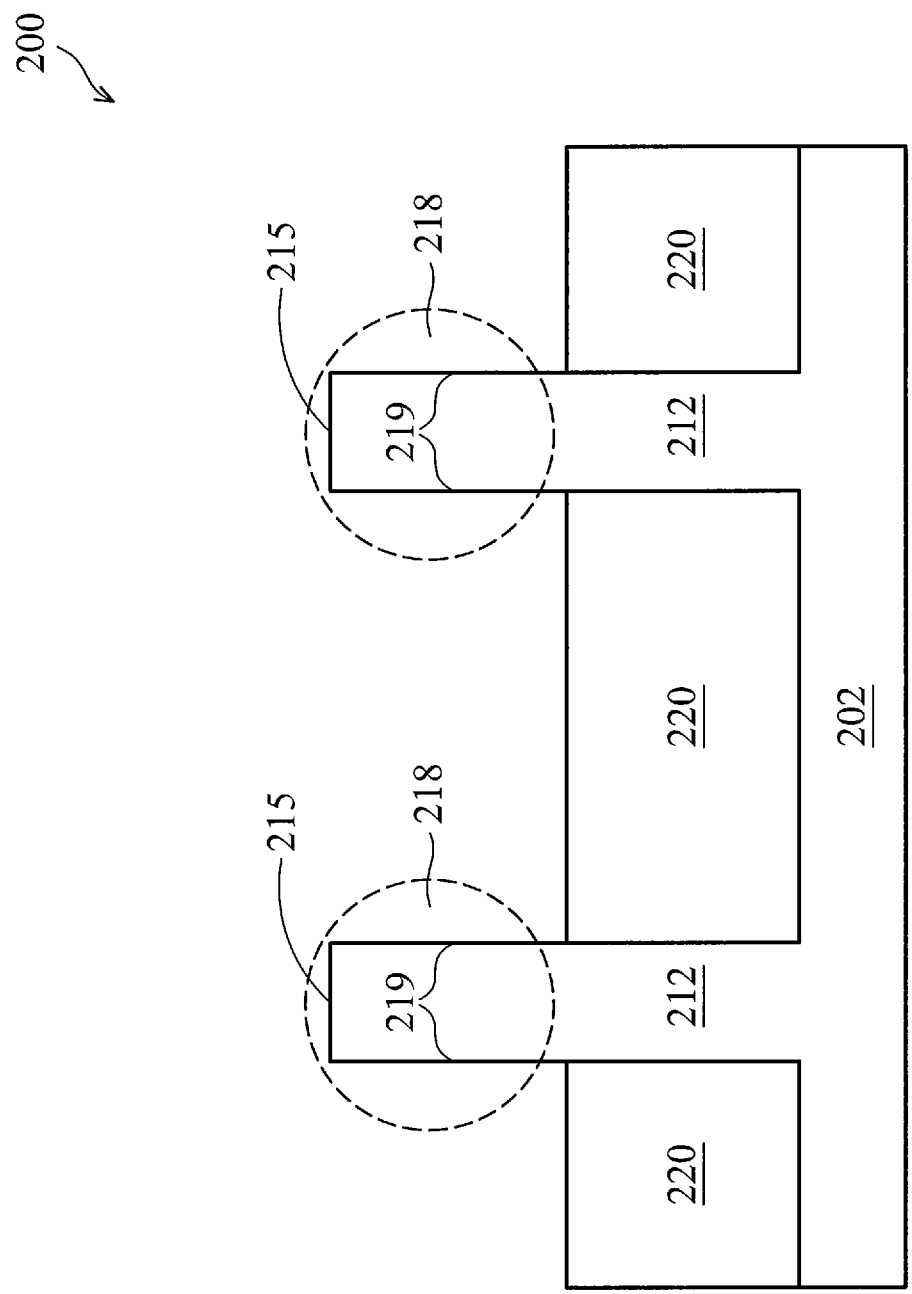

FIG. 6A is a perspective view of the FinFET 200 including respective upper fins 218 of the fins 212 being exposed at one of the various stages of fabrication corresponding to operation 110 of FIG. 1A, according to some embodiments, and FIG. 6B is a cross-sectional view of the FinFET 200 taken along line a-a of FIG. 6A. As shown, an isolation feature 220 is formed between respective lower portions of the neighboring fins 212 so as to expose the respective upper fins 218. In some embodiments, after the upper fins 218 are exposed, sidewalls 219 of the upper fins 218 are exposed together with the respective top surfaces 215.

In some embodiments, the isolation feature 220 may be formed by performing at least one etching process to recess an upper portion of the dielectric material 214 (FIGS. 5A and 5B). In an embodiment, the etching process may include performing a wet etching process such as, for example, dipping the substrate 202 in a hydrofluoric acid (HF) solution to recess the upper portion of the dielectric material 214 until the upper fins 218 are respectively exposed. In another embodiment, the etching process may include performing a dry etching process such as, for example, using etching gases fluoroform ($CHF_3$) and/or boron trifluoride ($BF_3$) to recess the upper portion of the dielectric material 214 until the upper fins 218 are respectively exposed.

Figure 7A:
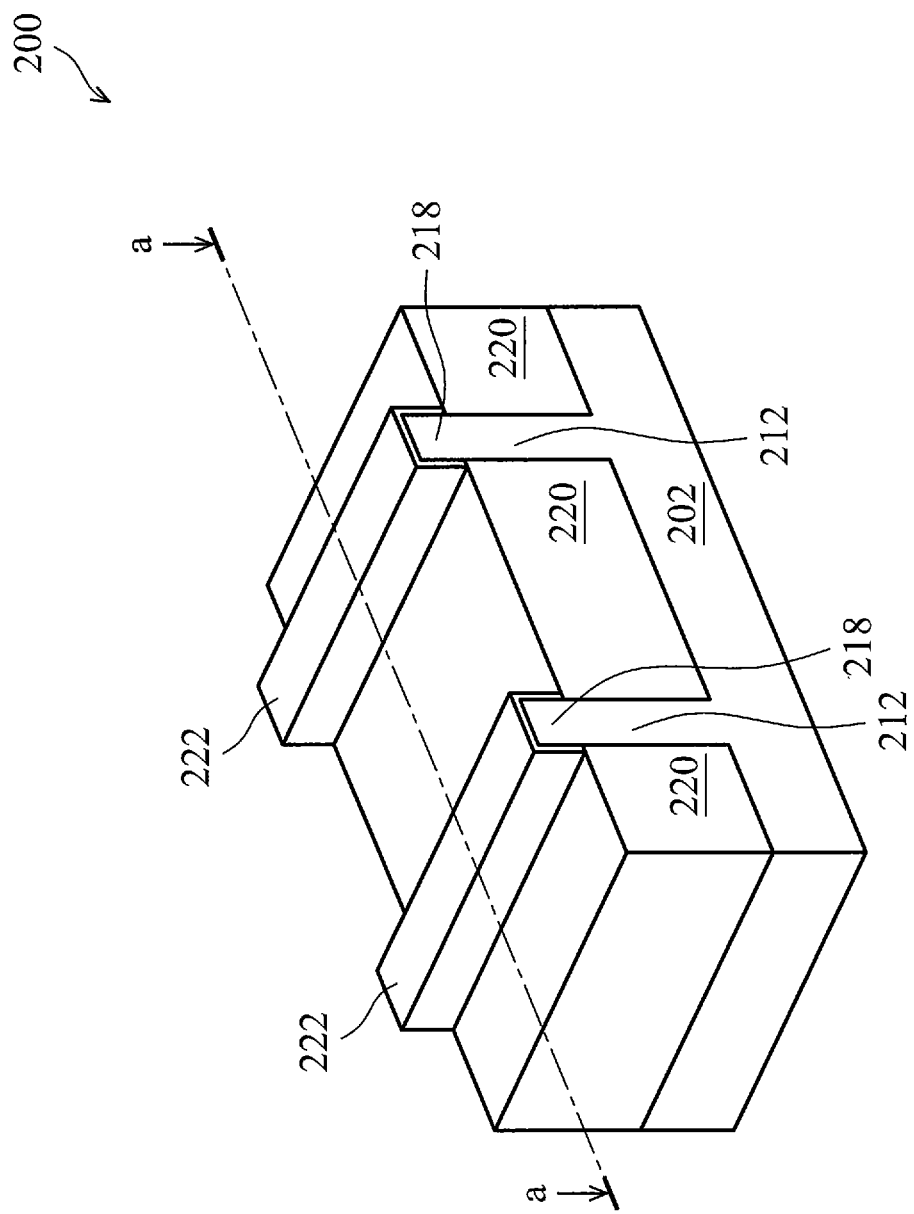
Figure 7B:
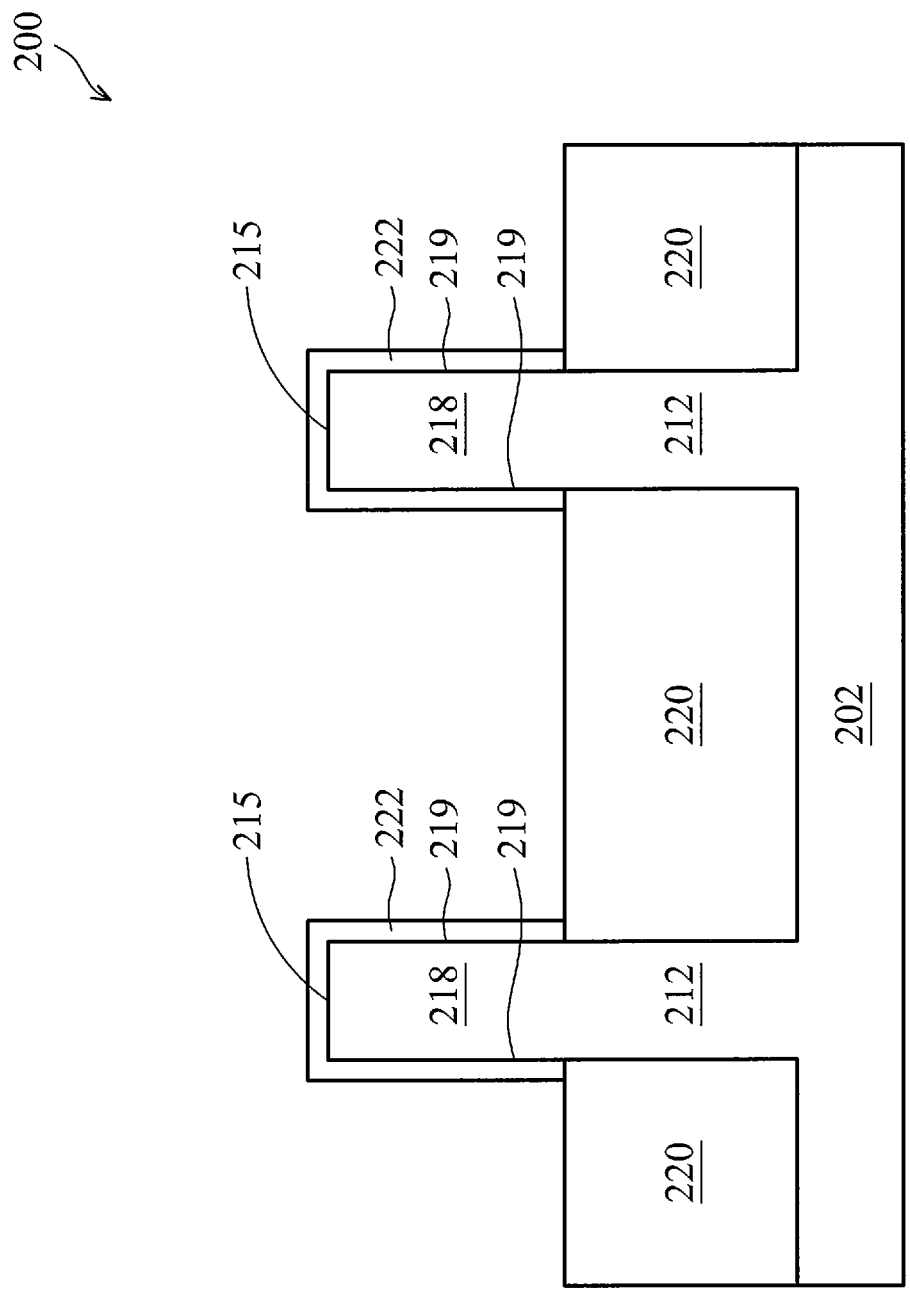

FIG. 7A is a perspective view of the FinFET 200 including an oxide layer 222 overlaying each of the upper fins 218 at one of the various stages of fabrication corresponding to the operation 112 of FIG. 1A, according to some embodiments, and FIG. 7B is a cross-sectional view of the FinFET 200 taken along line a-a of FIG. 7A. As shown, the oxide layer 222 is formed to extend along the sidewalls 219 and overlay the top surface 215 of the upper fin 218. In some embodiments, the oxide layer 220 may be formed by using a thermal oxidation process, an atomic layer deposition (ALD) process, a chemical vapor deposition (CVD) process, or the like. In the embodiments in which the upper fin 218 is formed of silicon, the oxide layer 220 may include silicon oxide.

Figure 8A:
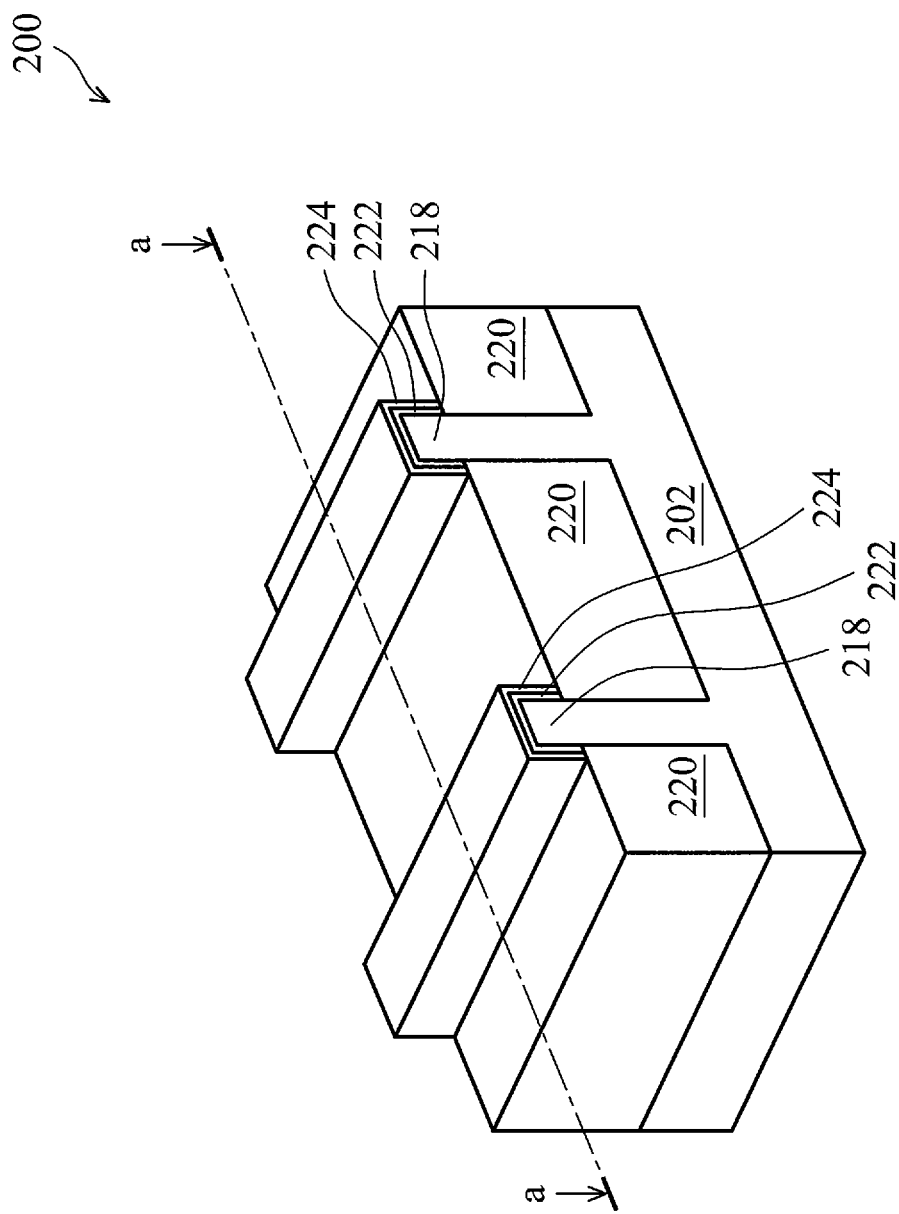
Figure 8B:
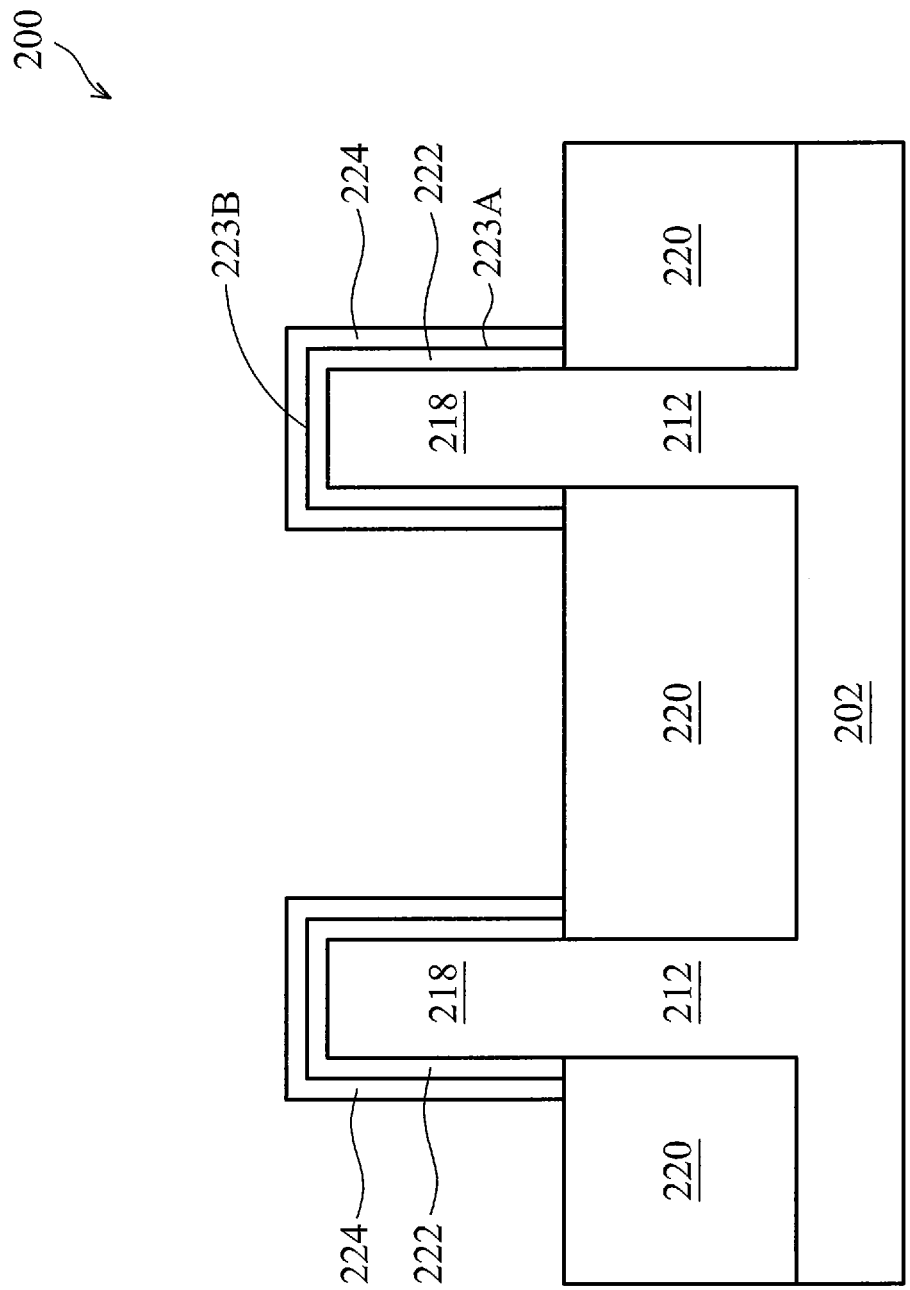

FIG. 8A is a perspective view of the FinFET 200 including a protection layer 224 overlaying the oxide layer 222 at one of the various stages of fabrication corresponding to the operation 114 of FIG. 1A, according to some embodiments, and FIG. 8B is a cross-sectional view of the FinFET 200 taken along line a-a of FIG. 8A. In some embodiments, the protection layer 224 is formed to extend along sidewalls 223A and overlay a top surface 223B of the oxide layer 222. As such, the oxide layer 222 and the overlaid upper fin 218 can be protected by the protection layer 224 during subsequent doping and dummy gate removal processes, which will be discussed in FIGS. 9A-9B and 11A-11B, respectively.

In some embodiments, the protection layer 224 includes a dielectric material selected from: silicon nitride (SiN), silicon oxynitride (SiON), or a combination thereof. In the example in which the protection layer 224 includes SiN, the protection layer 224 may be formed by depositing SiN onto the FinFET 200 using at least one of an electroplating process, a sputtering process, a CVD process, and an ALD process, followed by one or more patterning processes to cause the SiN to be formed along the sidewalls 229A and over the top surface 223B. In the example in which the protection layer 224 includes SiON, the protection layer 224 may be formed by first depositing SiN onto the FinFET 200 using at least one of an electroplating process, a sputtering process, a CVD process, and an ALD process, followed by an oxidation process (e.g., an oxygen plasma oxidation process) to convert the SiN to SiON and one or more patterning processes to cause the SiON to be formed along the sidewalls 229A and over the top surface 223B. In some embodiments, part of the oxide layer 222 and part of the protection layer 224 may together serve as a gate dielectric layer of the FinFET 200 and part of the upper fin 218 may serve as a conduction channel of the FinFET 200, which will be discussed in further detail below.

Figure 9A:
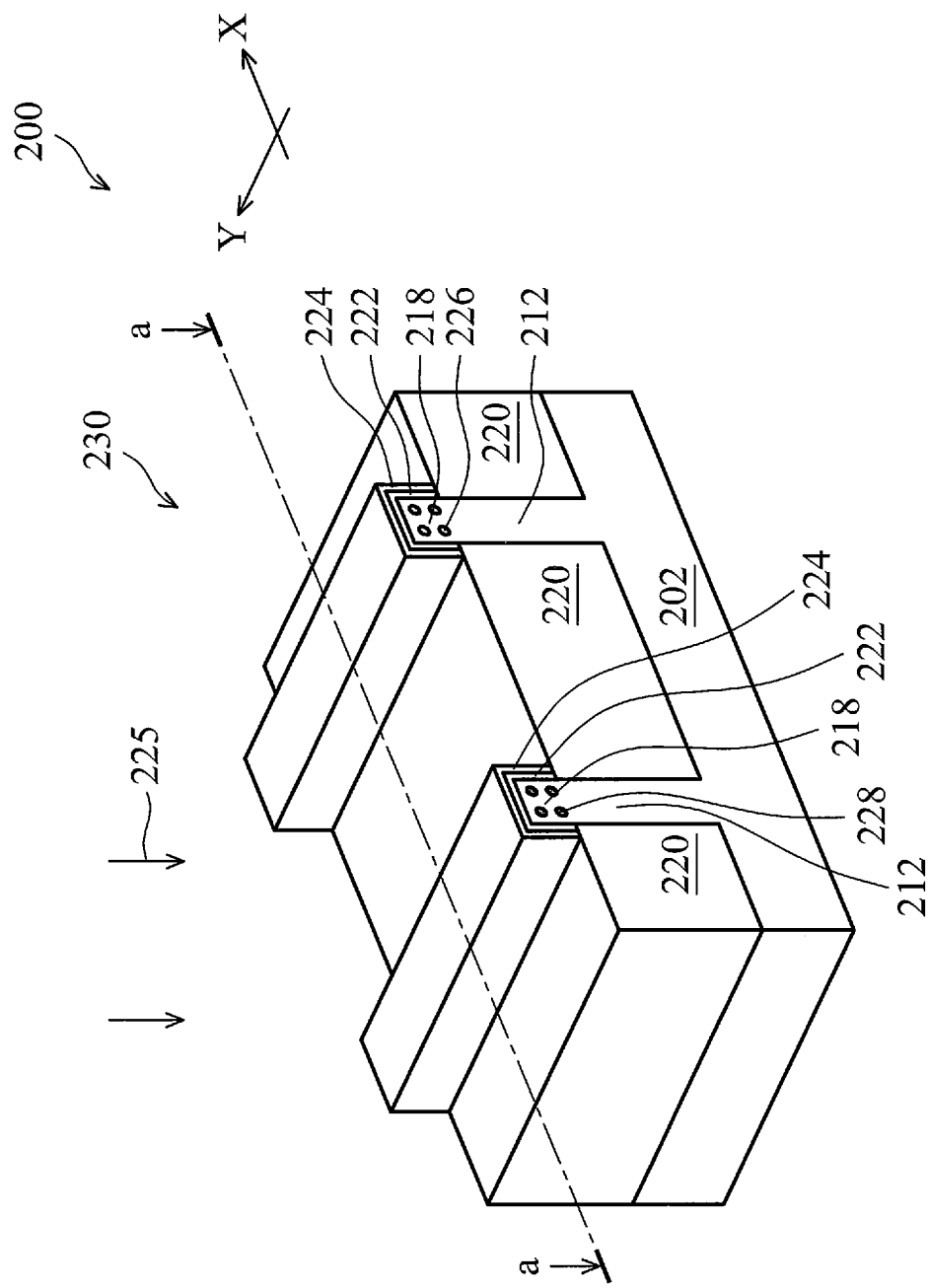
Figure 9B:
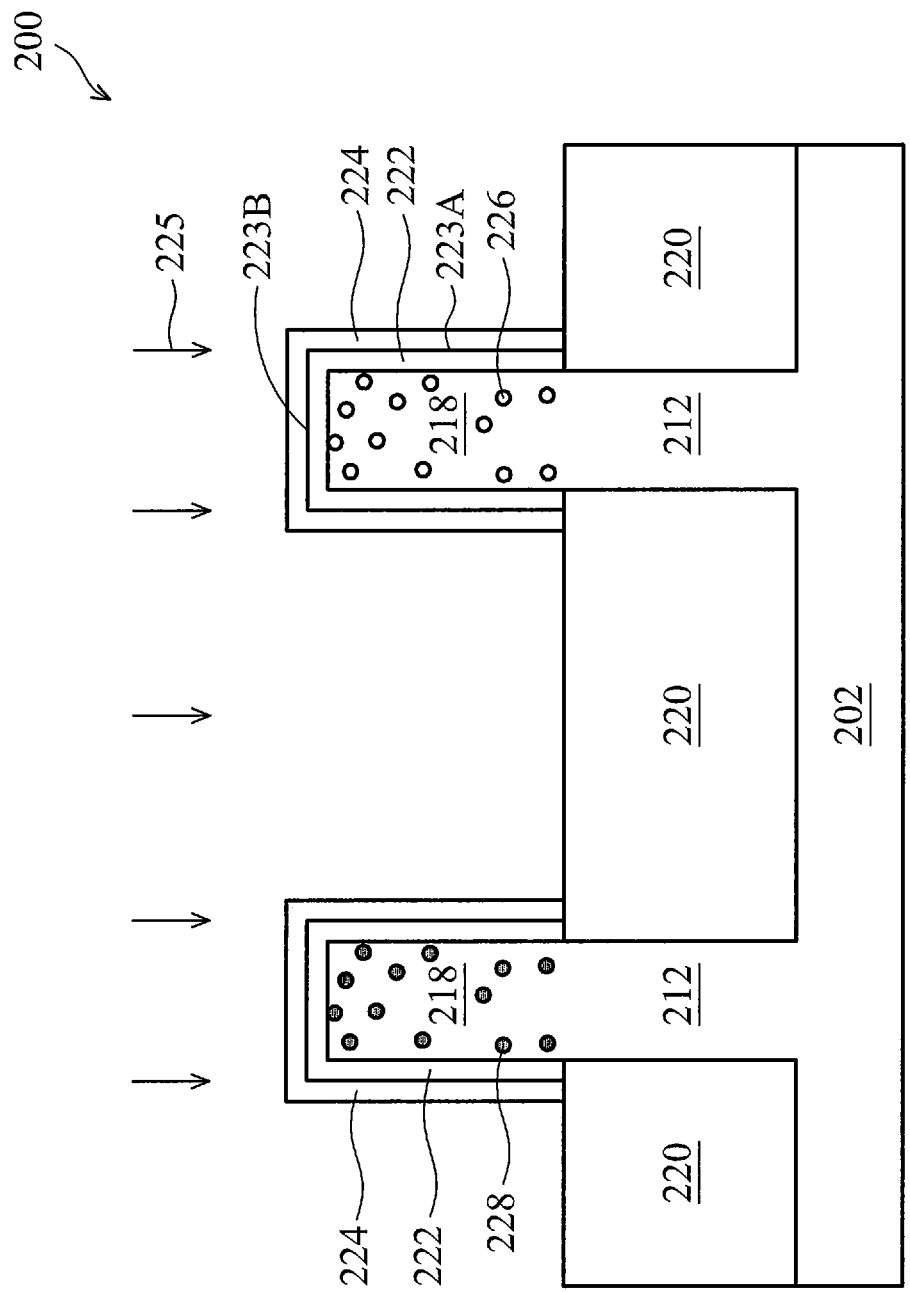

FIG. 9A is a perspective view of the FinFET 200 including doped upper fins 218 at one of the various stages of fabrication corresponding to the operation 116 of FIG. 1A, according to some embodiments, and FIG. 9B is a cross-sectional view of the FinFET 200 taken along line a-a of FIG. 9A. As shown, the doped upper fins 218 may be formed by incorporating a plurality of dopants (e.g., 226, 228, etc.) into respective crystalline structures of the un-doped upper fins 218, and such a dopant incorporation process generally includes an ion implantation process, e.g., 225, according to some embodiments of the present disclosure. As mentioned above, the ion implantation process 225 typically includes: energizing a plurality of dopants in respective ionized forms by an ion source, bombarding the energized dopants (ions) onto a target to be doped (e.g., the upper fins 218) to implant the dopants into the target, and annealing the target to activate the implanted dopants (e.g., 226, 228, etc.).

In some embodiments, a first portion of the upper fins of the FinFET 200 may be doped with a first type of dopants, and a second portion of the upper fins of the FinFET 200 may be doped with a second type of dopants, wherein the first and second types are different from each other. For example, the left upper fin 218 and the right upper fin 218, in FIG. 9B, may be doped with p-type (e.g., 228) and n-type dopants (e.g., 226), respectively. More specifically, the p-type dopant may include boron, $BF_2$, and/or a combination thereof; and the n-type dopant may include phosphorus, arsenic, and/or a combination thereof.

In the above example where the right and left upper fins 218 are doped with respective different dopants 226 and 228, the doped upper fins 218 may be formed by at least one of the following processes: forming a first patterned mask layer (e.g., a hardmask layer) to cover the left upper fin 218;

performing a first ion implantation process to implant the dopants 226 into the right upper fin 218; removing the first patterned mask layer; forming a second patterned mask layer (e.g., a hardmask layer) to cover the right upper fin 218; performing a second ion implantation process to implant the dopants 228 into the left upper fin 218; removing the second patterned mask layer; and annealing the left and right upper fins 218. As such, the dopants 226 and 228 may be distributed, either uniformly or nonuniformly, along the Y direction (FIG. 9A) in the right and left upper fins 218, respectively. For clarity, the dopants 226 and 228 in the upper fins will not be shown in the following figures.

As mentioned above, part of the upper fin 218 may serve as the conduction channel of the FinFET 200. Conventionally, without the protection layer 224 formed over the upper fin 218, the bombarding dopants in the ion implantation process generally cause damage to the oxide layer 222 and the beneath upper fin 218 even with the oxide layer 222 formed thereupon (since the oxide layer 222 is formed substantially thin). In stark contrast, with the protection layer 224 formed over the oxide layer 222 and the upper fin 218, the bombardment of the dopants may advantageously minimize the damage, if any, caused to the oxide layer 222 and the overlaid upper fin 218. As such, the above-mentioned issues that typically occur while using conventional methods to make a FinFET may be avoided.

Figure 10A:
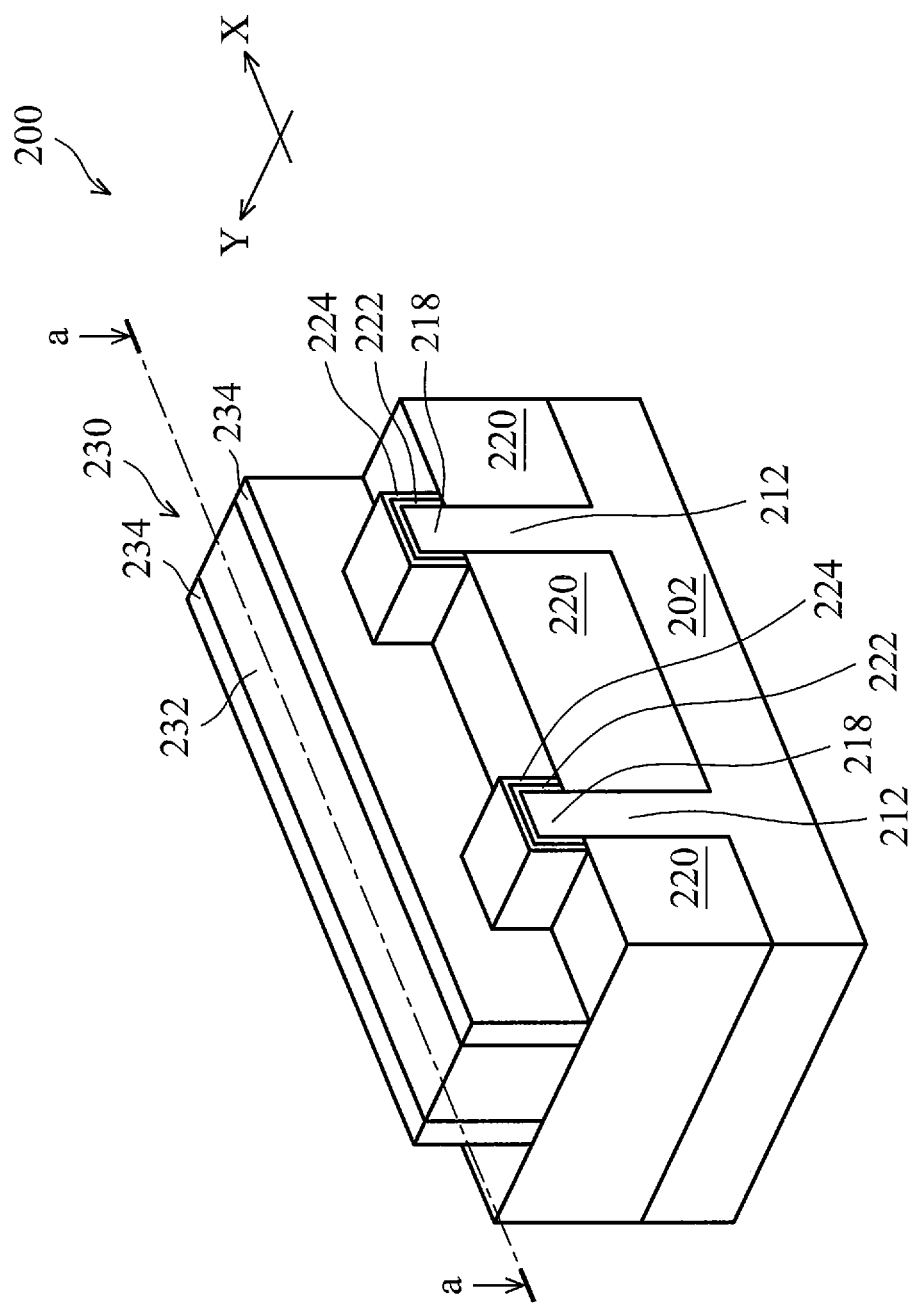
Figure 10B:
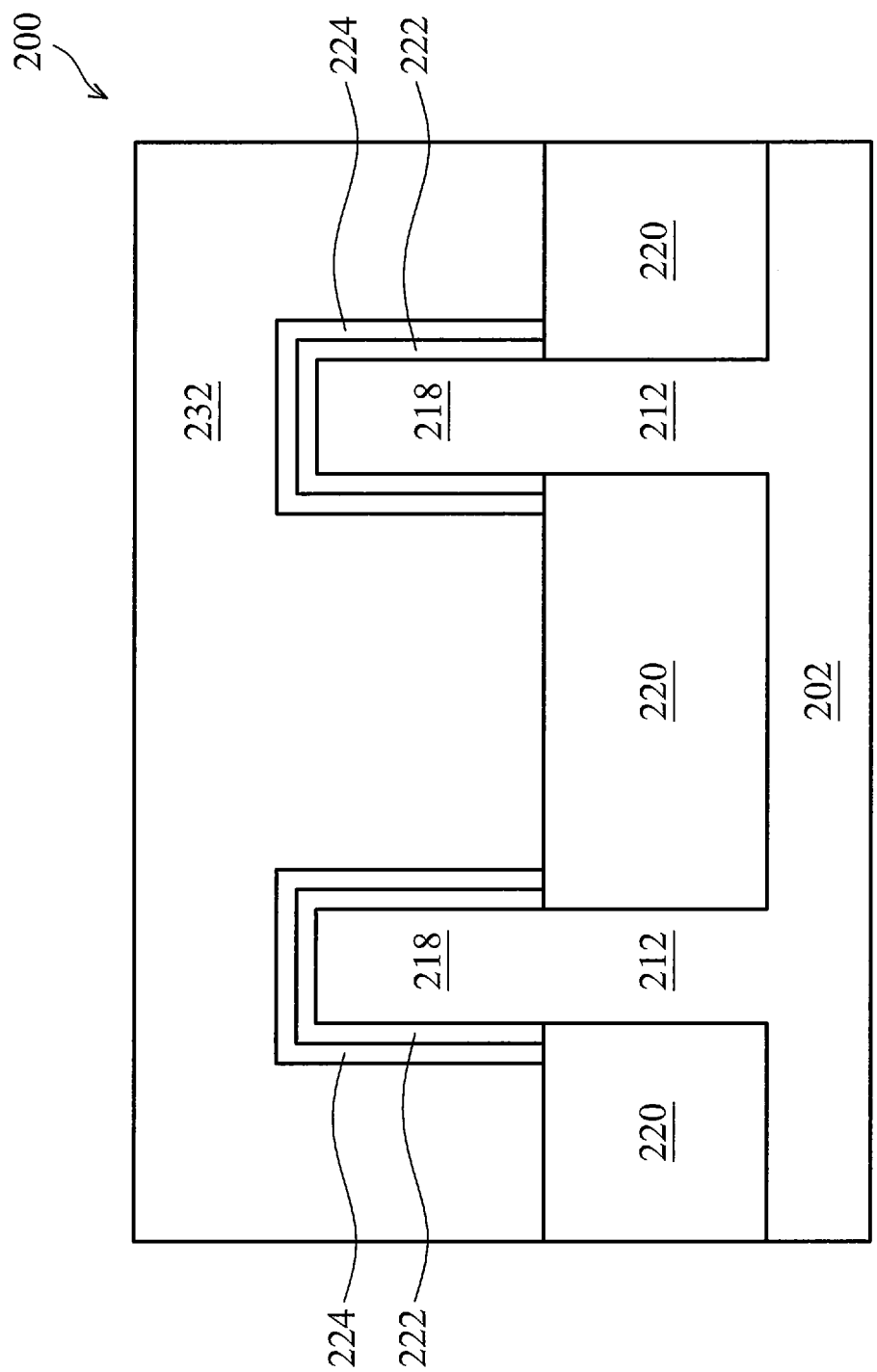

FIG. 10A is a perspective view of the FinFET 200 including a dummy gate stack 230 extending along the X direction so as to overlay the one or more upper fins 218, and the Y direction so as to overlay respective central portions of the upper fins 218, the oxide layer 222, and the protection layer 224 at one of the various stages of fabrication corresponding to operation 118 of FIG. 1A, according to some embodiments, and FIG. 10B is a cross-sectional view of the FinFET 200 taken along line a-a of FIG. 10A. As shown, the dummy gate stack 230 is formed to overlay the central portion of the upper fin 218 with the respective central portions of the oxide layer 222 and protection layer 224 being sandwiched therebetween.

In some embodiments, the central portion of the upper fin 218, overlaid by the dummy gate stack 230, may serve as a conduction channel (along the Y direction) of the FinFET 200, and the central portions of the oxide layer 222 and the protection layer 224 disposed between such the conduction channel and the dummy gate stack 230 may together serve as the gate dielectric layer of the FinFET 200. In some alternative embodiments, the central portions of the oxide layer 222 and the protection layer 224 may be replaced by a high-k dielectric layer, which is used to serve as the gate dielectric layer of the FinFET 200.

The dummy gate stack 230 includes a dummy gate electrode 232, which will be removed in a later removal process, and spacer layers 234 extending along sidewalls of the dummy gate electrode 232. In some embodiments, the dummy gate electrode 232 may comprise a polysilicon material. Further, the dummy gate electrode 232 may be a polysilicon material doped with a uniform or non-uniform doping concentration. The dummy gate electrode 232 may be formed using a suitable process such as ALD, CVD, physical vapor deposition (PVD), plating, or combinations thereof.

In some embodiments, the spacer layer 234 may include silicon oxide (SiO), silicon nitride (SiN), silicon oxynitride (SiON), or other suitable material. The spacer layer 234 may comprise a single layer or multilayer structure. In some embodiments, the spacer layer 234 may be formed by depositing a blanket layer of the spacer layer 234 by CVD, PVD, ALD, or other suitable technique, and performing an anisotropic etching process on the blanket layer to form the pair of the spacer layer 234 along the sidewalls of the gate electrode 232, as shown in the illustrated embodiment of FIG. 10A.

Figure 1B:
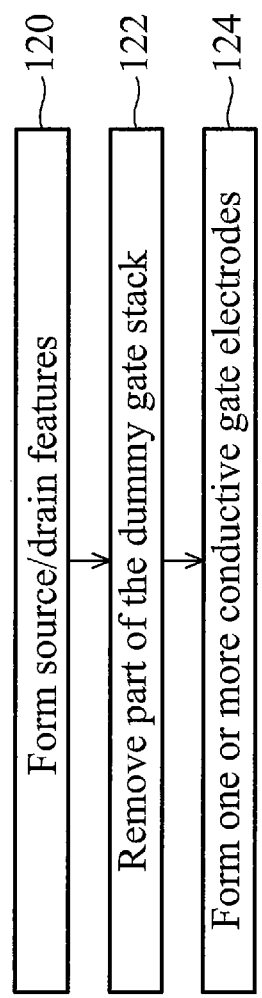
Figure 11A:
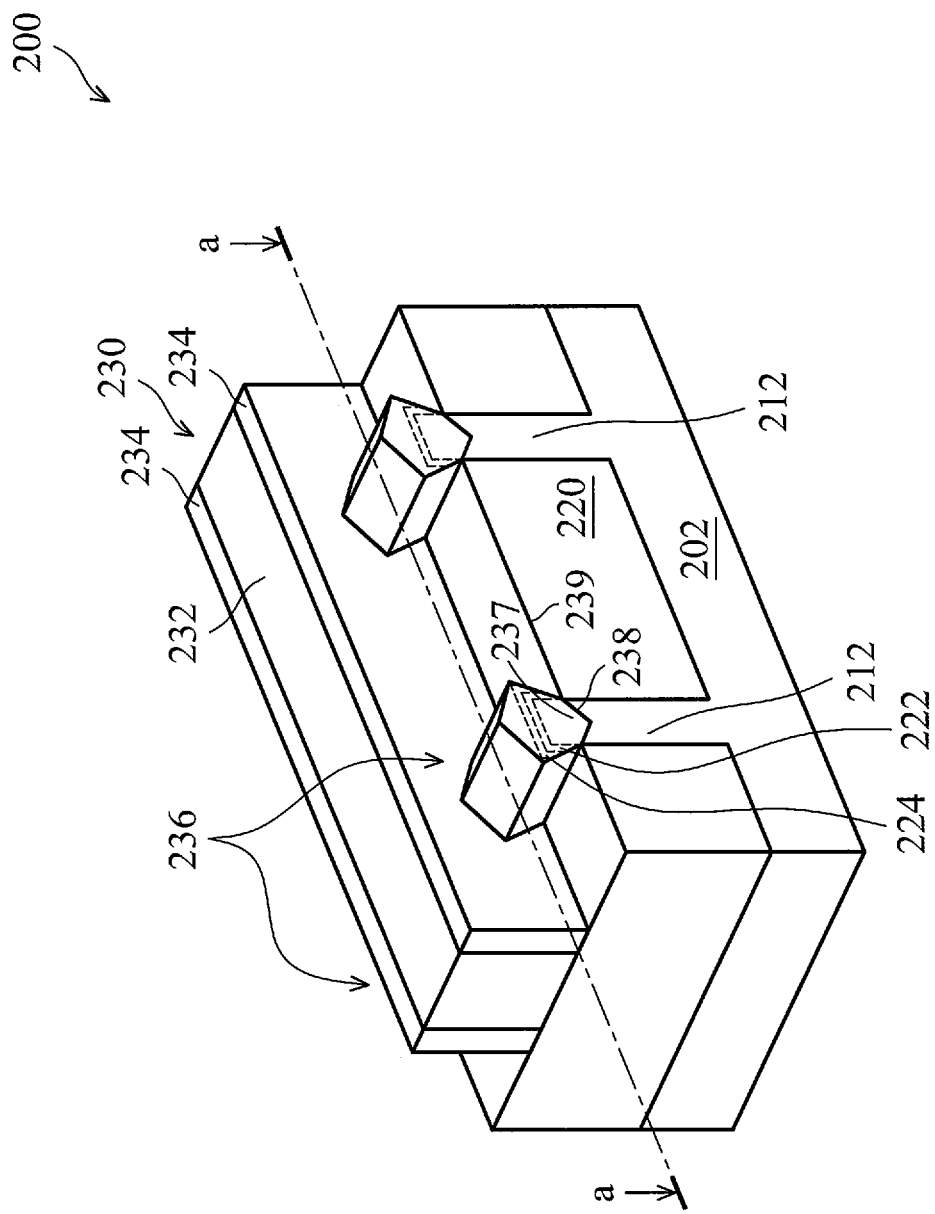
Figure 11B:
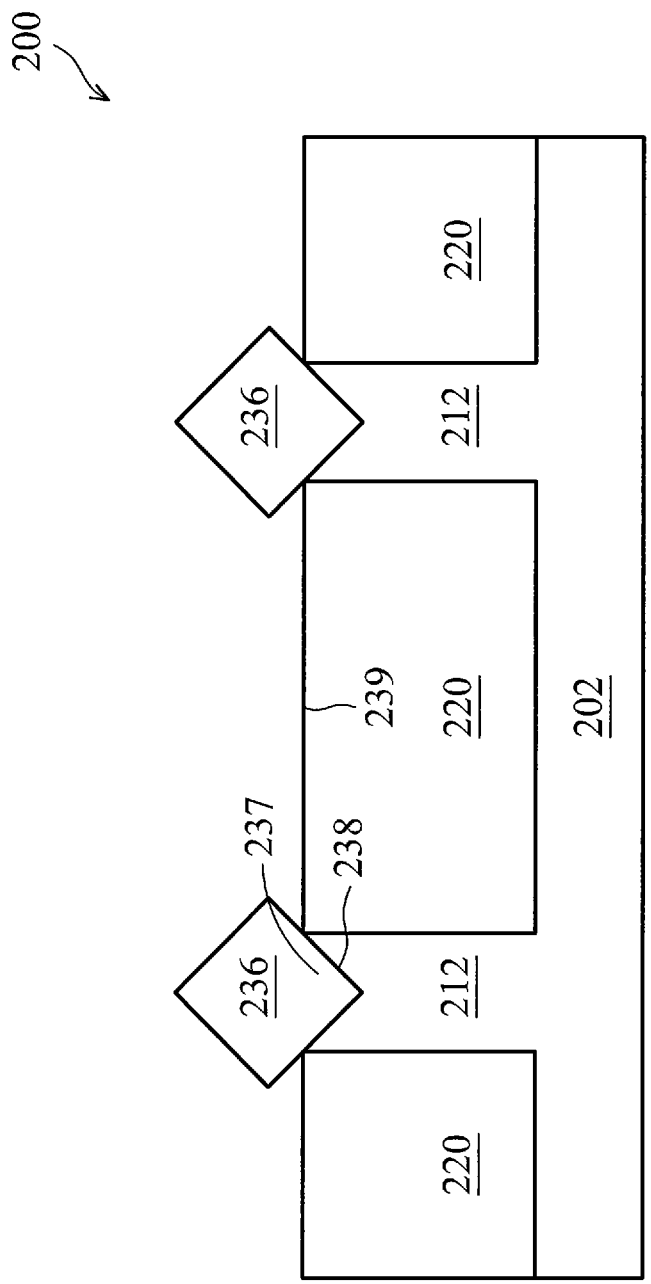

FIG. 11A is a perspective view of the FinFET 200 including source/drain features 236 formed on side portions of the fin 212 that are not covered by the dummy gate stack 230 at one of the various stages of fabrication corresponding to the operation 120 of FIG. 1B, according to some embodiments, and FIG. 11B is a cross-sectional view of the FinFET 200 taken along line a-a of FIG. 11A. It is noted the line a-a of FIG. 11A is not taken across the dummy gate stack 230, but across the source/drain features 236. In some embodiments, the respective side portions of the protection layer 224, the oxide layer 222, and at least part of the upper fin 218 are removed before the formation of the source/drain features 236, so that the removed side portions of the protection layer 224, the oxide layer 220, and the upper fin 218 are shown in dotted lines, respectively, in FIG. 11A. The formation of the source/drain feature 236 will be briefly described as follows.

In some embodiments, the side portions of the protection layer 224 and the oxide layer 220 not covered by the gate stack 230 are removed, respectively or concurrently, by one or more selective wet/dry etching processes, and the side portions of the upper fin 218 are removed by one or more other selective wet/dry etching processes so as to form respective recesses 237 on the sides of the dummy gate stack 230. In some embodiments, each recess 237 has a bottom surface 238. Such a recess 237 may be extended downwardly beneath a top surface 239 of the isolation feature 220, i.e., the bottom surface 238 is vertically lower than the top surface 239. Subsequently, the source/drain features 236 are epitaxially grown from the fin 212 by using a low-pressure chemical vapor deposition (LPCVD) process and/or a metal-organic chemical vapor deposition (MOCVD) process.

Figure 12A:
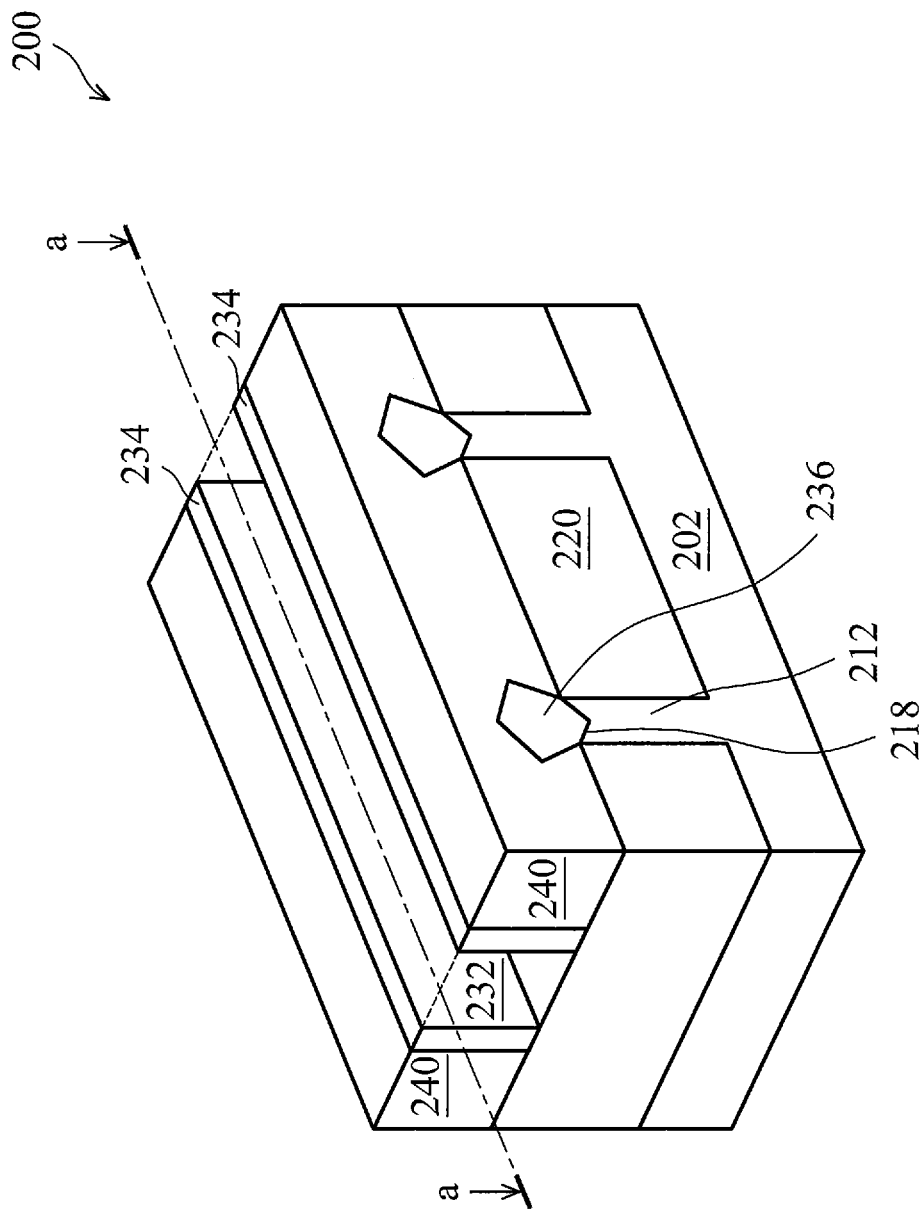
Figure 12B:
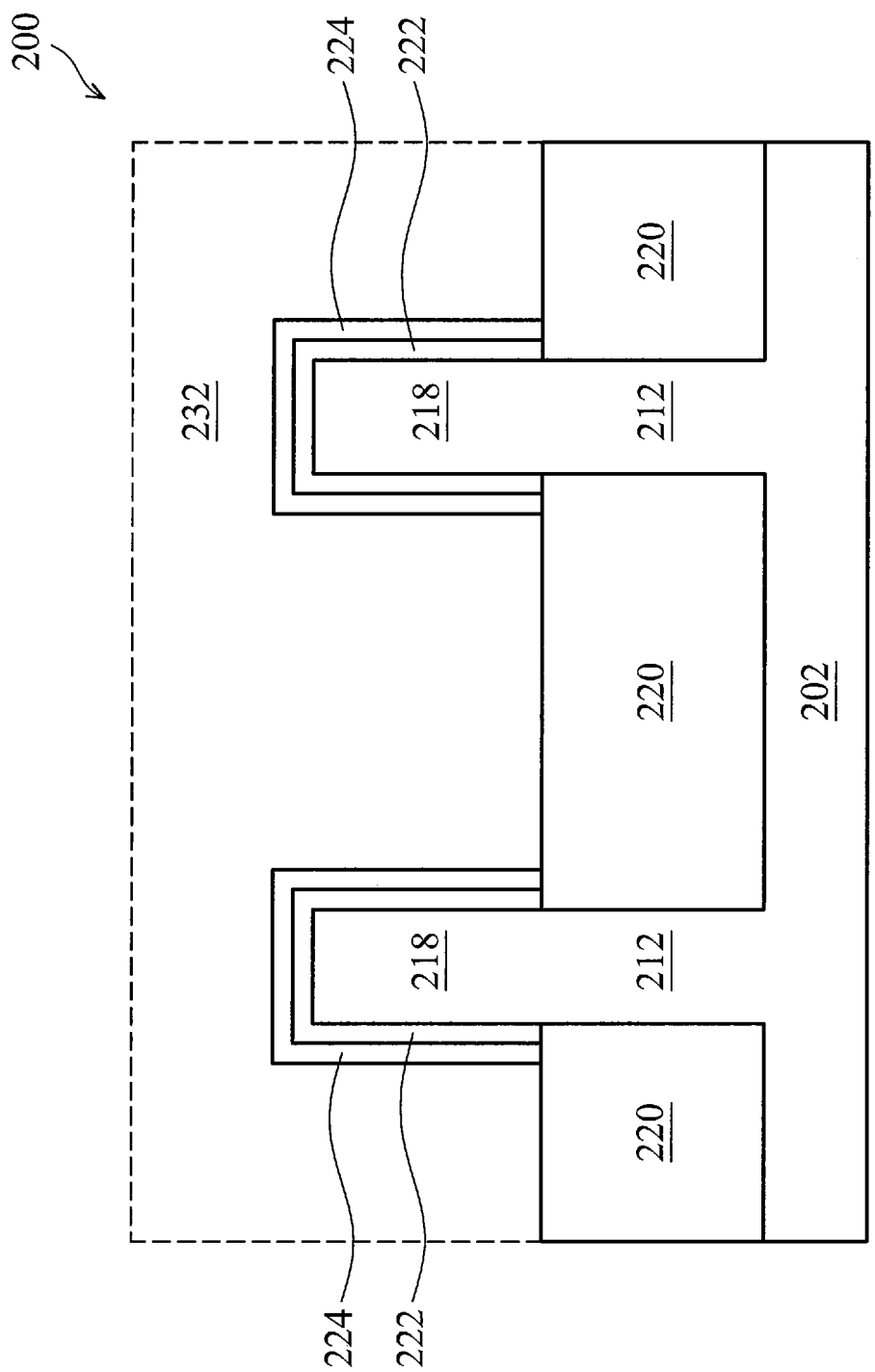

FIG. 12A is a perspective view of the FinFET 200 with the dummy gate electrode 232 being removed at one of the various stages of fabrication corresponding to the operation 122 of FIG. 1B, according to some embodiments, and FIG. 12B is a cross-sectional view of the FinFET 200 taken along line a-a of FIG. 12A. For purposes of illustration, the removed dummy gate electrode 232 is shown in dotted line. As shown, after the dummy gate electrode 232 is removed, the central portion of the protection layer 224 (that was overlaid by the dummy gate electrode 232) is exposed.

In some embodiments, prior to the dummy gate electrode 232 being removed, a dielectric layer 240 may be formed over the source/drain features 236 to protect the formed source/drain features 236. Such a dielectric layer 240 may include a material that is selected from at least one of: silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Further, in some embodiments, concurrently with or subsequently to the dummy gate electrode 232 being removed, the spacer layer 234 may remain intact. In the example in which the dummy gate electrode 232 includes a polysilicon material, the dummy gate electrode 232 may be removed (etched) by one or more selective dry and/or wet etching processes until the central portion of the protection layer 224 that was covered by the dummy gate electrode 232 is exposed. More specifically, in some embodiments, the wet etching process includes using diluted hydrofluoric acid (DHF), and/or an amine derivative etchant (e.g., $NH_4OH$, $NH_3(CH_3)OH$, TetraMethyl Ammonium Hydroxide (TMAH), etc.); and the dry etching process includes using a plasma of reactive gas that is selected from: fluorocarbons, oxygen, chlorine, boron trichloride, nitrogen, argon, helium, or a combination thereof.

Figure 13A:
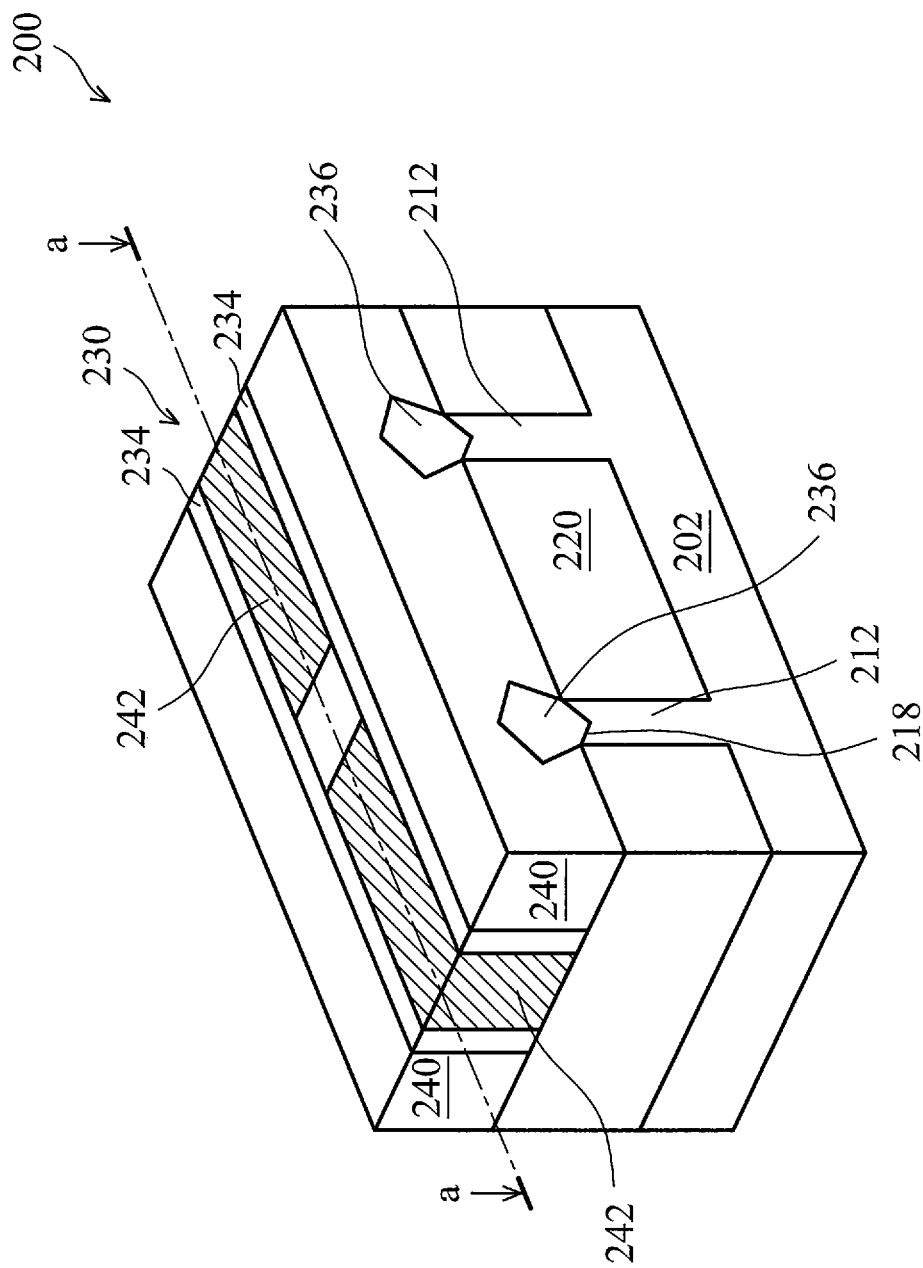
Figure 13B:
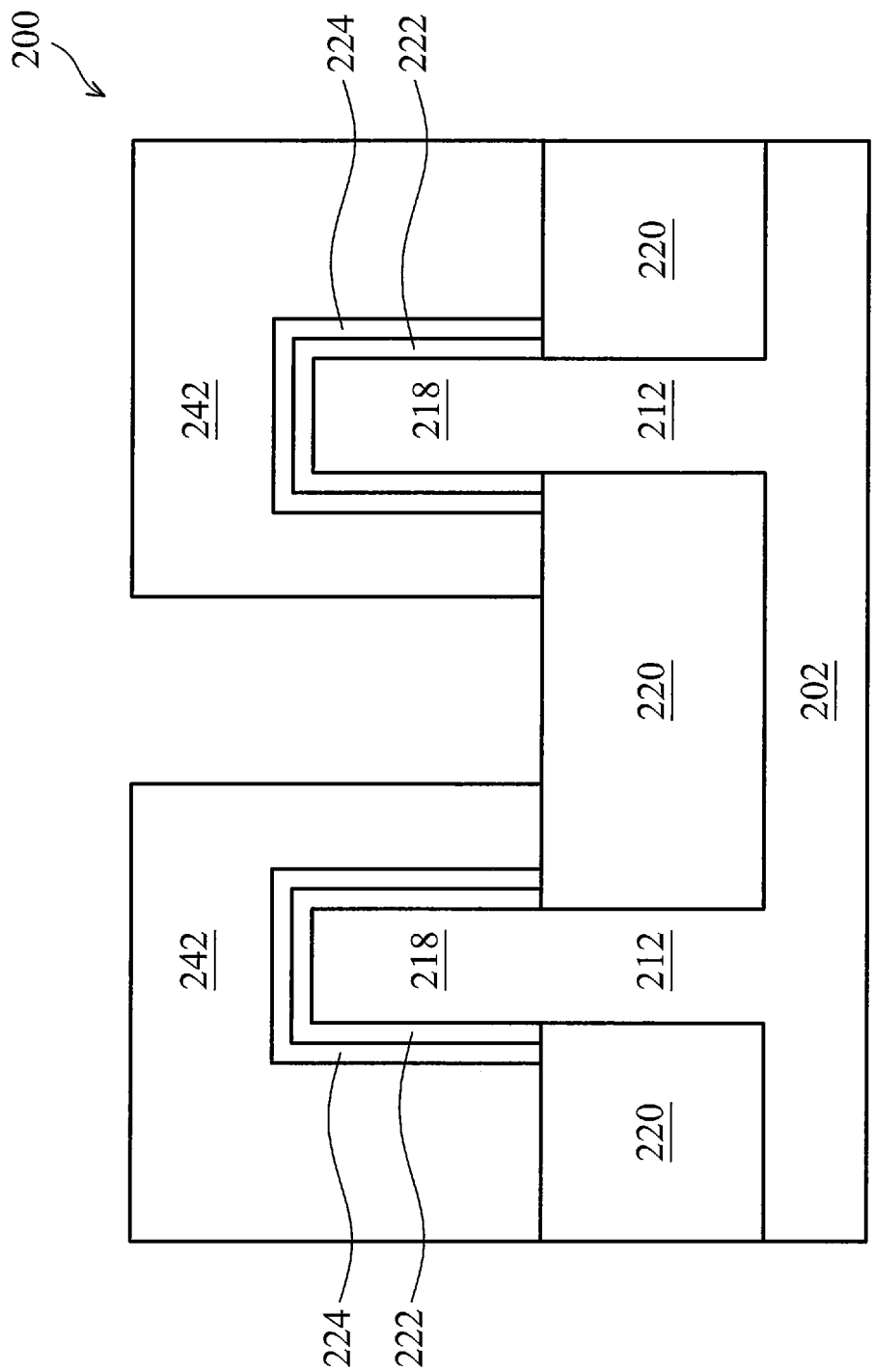

FIG. 13A is a perspective view of the FinFET 200 including one or more conductive gate electrodes 242 formed over the respective exposed portions (i.e., the respective central portions) of the protection layers 224 at one of the various stages of fabrication corresponding to the operation 124 of FIG. 1B, according to some embodiments, and FIG. 13B is a cross-sectional view of the FinFET 200 taken along line a-a of FIG. 13A. More specifically, as shown in the cross-sectional view of FIG. 13B, the central portion of the upper fin 218 is overlaid by the respective conductive gate electrode 242 with the respective central portions of the oxide layer 222 and the protection layer 224 sandwiched therebetween, and as shown in the perspective view of FIG. 13A, the source/drain features 236 (i.e., the side portions of the upper fin 218 that were not covered by the dummy gate stack 230) are respectively overlaid by the dielectric layer 240. Although the conductive gate electrodes 242 are formed as two separate layers to overlay the left and right upper fins 218, respectively, it is noted that the conductive gate electrodes 242 may be together formed as a single layer to overlay both the left and right upper fins 218 while remaining within the scope of the present disclosure.

In some embodiments, the conductive gate electrode 242 may include a metal material such as, for example, Al, Cu, W, Ti, Ta, TiN, TiAl, TiAlN, TaN, NiSi, CoSi, or combinations thereof. In some alternative embodiments, the conductive gate electrode 242 may include a polysilicon material, wherein the polysilicon material may be doped with a uniform or non-uniform doping concentration. The conductive gate electrode 242 may be formed using a suitable process such as ALD, CVD, PVD, plating, or combinations thereof.

A conventional replacement gate process to make a FinFET generally includes forming a dummy poly gate over the FinFET's fin channel with a gate dielectric layer formed therebetween, voiding the dummy poly gate, and subsequently refilling such a void with a conductive material (e.g., a metal material) so as to form a metal gate feature over the fin channel. The voiding process of the dummy poly gate may be performed through one or more dry/etch etching processes, which typically causes direct damage to the gate dielectric layer. However, the protection layer 224 of the present disclosure, in addition to protecting the upper fin 218 and the oxide layer 222 during the ion implantation process (i.e., operation 116 of FIG. 1, and FIGS. 9A-9B), also provides another layer of protection on the oxide layer 222 during the dummy gate removal process (i.e., operation 122 of FIG. 1, and FIGS. 12A-12B).

In an embodiment, a method for forming a fin-based transistor includes forming a fin on a substrate; overlaying at least an upper portion of the fin by an oxide layer and a protection layer, wherein the protection layer is formed above the oxide layer; and doping at least the upper portion of the fin by using an ion implantation process, wherein the protection layer protects against damage to at least the upper portion of the fin and the oxide layer during the ion implantation process.

In another embodiment, a method for forming a fin-based transistor includes forming a fin on a substrate; exposing an upper portion of the fin; overlaying the upper portion of the fin by an oxide layer and a protection layer, wherein the protection layer overlays the oxide layer; and doping the upper portion of the fin by using an ion implantation process, wherein the protection layer protects against damage to the upper portion of the fin during the ion implantation process.

Yet in another embodiment, a method for forming a fin-based transistor includes forming a first fin and a second fin on a substrate, the first and second fins being laterally spaced from each other; overlaying respective upper portions of the first and second fins by an oxide layer and a protection layer, wherein the protection layer is formed above the oxide layer; and doping at least the respective upper portion of the first fin by using a first ion implantation process with a first type of dopant and then doping at least the respective upper portion of the second fin by using a second ion implantation process with a second type of dopant, wherein the protection layer protects against damage to at least the respective upper portions of the first and second fins and the oxide layer during the first and second ion implantation processes.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin-based transistor, comprising:
   forming a fin on a substrate;
   overlaying at least an upper portion of the fin by an oxide layer and a protection layer, wherein the protection layer is formed above the oxide layer;
   doping at least the upper portion of the fin by using an ion implantation process, wherein the protection layer protects against damage to at least the upper portion of the fin and the oxide layer during the ion implantation process;
   forming a dummy gate stack overlaying respective central portions of the protection layer, the oxide layer, and the fin, wherein the central portions of the protection layer and the oxide layer serve as a gate dielectric layer of the fin-based transistor;
   removing side portions of the protection layer and the oxide layer that are not overlaid by the dummy gate stack;
   recessing side portions of the fin that are not overlaid by the dummy gate stack; and
   forming source and drain features in the recessed side portions of the fin.

2. The method of claim 1, furthering comprising:
   forming one or more isolation features overlaying a lower portion of the fin.

3. The method of claim 1, wherein the protection layer comprises a dielectric material selected from silicon nitride, silicon oxynitride, and a combination thereof.

4. The method of claim 1, wherein the ion implantation process includes bombarding a plurality of dopants into the upper portion of the fin.

5. The method of claim 4, wherein the protection layer is configured to reduce damage to the oxide layer and the upper portion of the fin that is caused by the bombardment of the plurality of dopants.

6. The method of claim 1, wherein a first portion of the upper fin is doped with a first dopant and a second portion of the upper fin is doped with a second dopant different from the first dopant.

7. The method of claim 1, further comprising:
  removing at least part of the dummy gate stack by at least one etching process thereby exposing the central portion of the protection layer; and
  forming a metal gate electrode over the exposed central portion of the protection layer.

8. The method of claim 7, wherein the protection layer is configured to protect the oxide layer during the at least one etching process.

9. A method for forming a fin-based transistor, comprising:
  forming a fin on a substrate;
  exposing an upper portion of the fin;
  overlaying the upper portion of the fin by an oxide layer and a protection layer, wherein the protection layer overlays the oxide layer and comprises a dielectric material selected from a group comprising: silicon nitride, silicon oxynitride, and a combination thereof;
  doping the upper portion of the fin by using an ion implantation process, wherein the protection layer protects against damage to the upper portion of the fin during the ion implantation process;
  forming a dummy gate stack overlaying respective central portions of the protection layer, the oxide layer, and the fin, wherein the central portions of the protection layer and the oxide layer serve as a gate dielectric layer of the fin-based transistor;
  removing side portions of the protection layer and the oxide layer that are not overlaid by the dummy gate stack;
  recessing side portions of the fin that are not overlaid by the dummy gate stack; and
  forming source and drain features in the recessed side portions of the fin.

10. The method of claim 9, furthering comprising:
  forming one or more isolation features overlaying a lower portion of the fin to expose the upper portion of the fin.

11. The method of claim 9, wherein the ion implantation process includes bombarding a plurality of dopants into the upper portion of the fin.

12. The method of claim 9, further comprising:
  removing at least part of the dummy gate stack by at least one etching process thereby exposing the central portion of the protection layer; and
  forming a metal gate electrode over the exposed central portion of the protection layer.

13. The method of claim 12, wherein the protection layer is configured to protect the oxide layer during the at least one etching process.

14. A method for forming a fin-based transistor, comprising:
  forming a fin on a substrate;
  overlaying at least an upper portion of the fin by an oxide layer and a protection layer, wherein the protection layer is formed above the oxide layer;
  doping at least the upper portion of the fin by bombarding a plurality of dopants into the upper portion of the fin, wherein the protection layer protects against damage to at least the upper portion of the fin and the oxide layer during the bombarding;
  forming a dummy gate stack overlaying respective central portions of the protection layer, the oxide layer, and the fin, wherein the central portions of the protection layer and the oxide layer serve as a gate dielectric layer of the fin-based transistor;
  removing side portions of the protection layer and the oxide layer that are not overlaid by the dummy gate stack;
  recessing side portions of the fin that are not overlaid by the dummy gate stack;
  forming source and drain features in the recessed side portions of the fin;
  forming one or more isolation features overlaying a lower portion of the fin.

15. The method of claim 14, wherein the protection layer is configured to reduce damage to the oxide layer and the upper portion of the fin that is caused by the bombardment of the plurality of dopants.

16. The method of claim 14, wherein a first portion of the upper fin is doped with a first dopant and a second portion of the upper fin is doped with a second dopant different from the first dopant.

17. The method of claim 16, wherein the first dopant is a p-type dopant and the second dopant is an n-type dopant.

18. The method of claim 14, further comprising:
  removing at least part of the dummy gate stack by at least one etching process thereby exposing the central portion of the protection layer; and
  forming a metal gate electrode over the exposed central portion of the protection layer.

19. The method of claim 18, wherein the protection layer is configured to protect the oxide layer during the at least one etching process.

20. The method of claim 14, wherein the protection layer comprises a dielectric material selected from silicon nitride, silicon oxynitride, and a combination thereof.

* * * * *